United States Patent
Tachikawa et al.

(10) Patent No.: US 10,256,404 B2
(45) Date of Patent: Apr. 9, 2019

(54) MEMORY DEVICE

(71) Applicant: Toshiba Memory Corporation, Minato-ku (JP)

(72) Inventors: Takashi Tachikawa, Yokkaichi (JP); Masumi Saitoh, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/709,753

(22) Filed: Sep. 20, 2017

(65) Prior Publication Data
US 2018/0277759 A1 Sep. 27, 2018

(30) Foreign Application Priority Data

Mar. 22, 2017 (JP) .................................. 2017-056696

(51) Int. Cl.
*H01L 45/00* (2006.01)
*H01L 27/24* (2006.01)

(52) U.S. Cl.
CPC .......... *H01L 45/147* (2013.01); *H01L 27/249* (2013.01); *H01L 27/2436* (2013.01); *H01L 45/08* (2013.01); *H01L 45/1233* (2013.01)

(58) Field of Classification Search
None
See application file for complete search history.

(56) References Cited

U.S. PATENT DOCUMENTS

| 8,437,173 | B2 | 5/2013 | Hayakawa et al. |
| 8,698,277 | B2 | 4/2014 | Yamauchi et al. |
| 9,343,207 | B2 | 5/2016 | Fukuda et al. |

FOREIGN PATENT DOCUMENTS

| JP | 2008-243913 | 10/2008 |
| JP | 2010-267930 | 11/2010 |
| JP | 5436603 | 3/2014 |
| JP | 5547111 | 7/2014 |
| JP | 5696260 | 4/2015 |
| TW | 200908328 A | 2/2009 |

OTHER PUBLICATIONS

B. Govoreanu, et al. "Vacancy-Modulated Conductive Oxide Resistive Ram (VMCO-RRAM): An Area-Scalable Switching Current, Self-Compliant, Highly Nonlinear and Wide On/Off-Window Resistive Switching Cell," 2013, IEDM13, pp. 256-259.

*Primary Examiner* — Long Pham
(74) *Attorney, Agent, or Firm* — Oblon, McClelland, Maier & Neustadt, L.L.P.

(57) ABSTRACT

A memory device according to an embodiment includes a first conductive layer; a second conductive layer; a first metal oxide layer that is provided between the first conductive layer and the second conductive layer and includes at least one first metal element selected from the group consisting of aluminum (Al), gallium (Ga), zirconium (Zr), and hafnium (Hf); and a second metal oxide layer that is provided between the first metal oxide layer and the second conductive layer and includes at least one second metal element selected from the group consisting of zinc (Zn), titanium (Ti), tin (Sn), vanadium (V), niobium (Nb), tantalum (Ta), and tungsten (W). The first metal oxide layer includes a third metal element. The third metal element has a lower valence than a metal element having the highest atomic percent in the first metal oxide layer among the at least one first metal element.

6 Claims, 27 Drawing Sheets

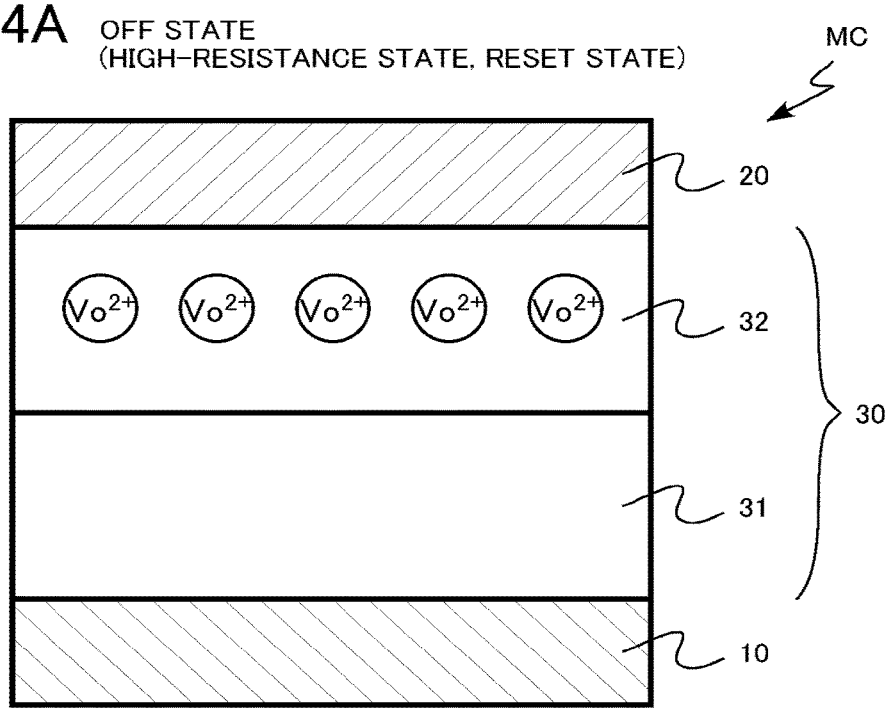
FIG.4A OFF STATE
(HIGH-RESISTANCE STATE, RESET STATE)
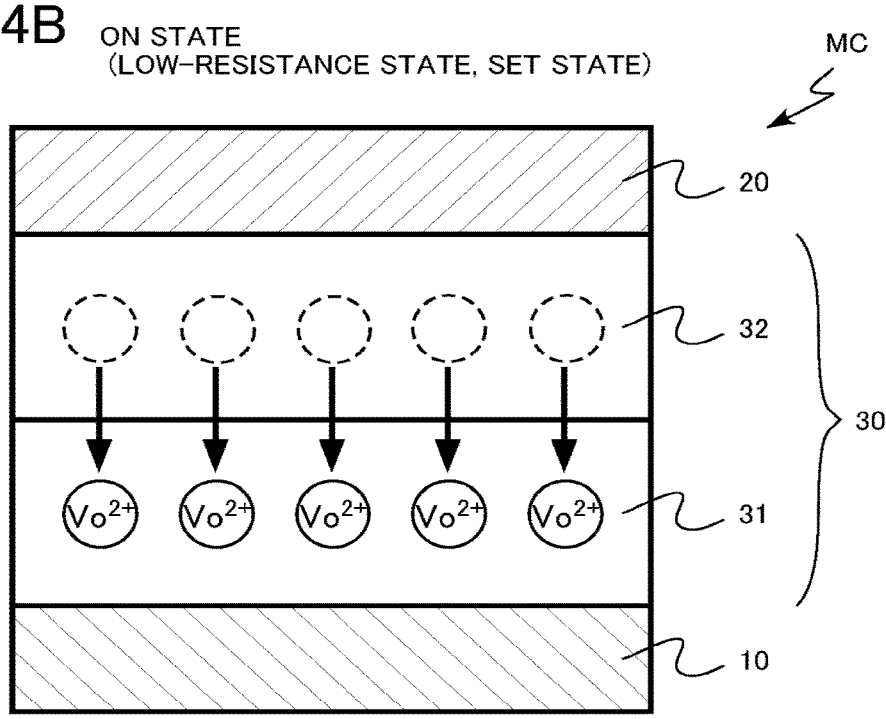
FIG.4B ON STATE
(LOW-RESISTANCE STATE, SET STATE)

MEMORY DEVICE

CROSS-REFERENCE TO RELATED APPLICATION

This application is based upon and claims the benefit of priority from Japanese Patent Application No. 2017-056696, filed on Mar. 22, 2017, the entire contents of which are incorporated herein by reference.

FIELD

Embodiments described herein relate generally to a memory device.

BACKGROUND

A NAND flash memory has been spread as a memory device storing a large amount of data. In recent years, a memory cell has been scaled down to reduce costs per bit or to increase the amount of data stored in a memory device. In contrast, a new memory device based on an operation principle different from that of a floating-gate flash memory is expected to be put to practical use. For example, a variable resistance memory with two terminals which is typified by a resistive random access memory (ReRAM) promises to be a next-generation memory in terms of a low-voltage operation, a high-speed switching, and ease of scaling-down.

An example of the variable resistance memory with two terminals is a variable resistance memory in which a variable resistance layer is made of metal oxide. In general, an electrical resistance value of metal oxide changes depending on the number of oxygen vacancies in a film. Therefore, a voltage is applied to metal oxide disposed between an upper electrode and a lower electrode to change the distribution of oxygen vacancies in the film. In this way, it is possible to switch the variable resistance layer between a high-resistance state and a low-resistance state.

In recent years, a variable resistance memory has drawn attention which does not include a single metal oxide layer, but includes two or more metal oxide layers and has a function that is not obtained in a single-layer ReRAM. For example, a stacked ReRAM obtained by stacking titanium oxide and aluminum oxide has self-compliance properties and two-dimensional conductivity and has drawn attention.

Since the stacked ReRAM has an asymmetric structure, in many cases, a set voltage (Vset) required to reduce resistance is different from a reset voltage (Vreset) required to increase resistance. For this reason, in some cases, one of the voltages does not satisfy required voltage specifications. Therefore, it is preferable to adjust the balance between the set voltage and the reset voltage in the stacked ReRAM.

BRIEF DESCRIPTION OF THE DRAWINGS

FIGS. 4A and 4B are diagrams illustrating an operation principle of the memory cell according to the comparative example;

DETAILED DESCRIPTION

Figure 1:
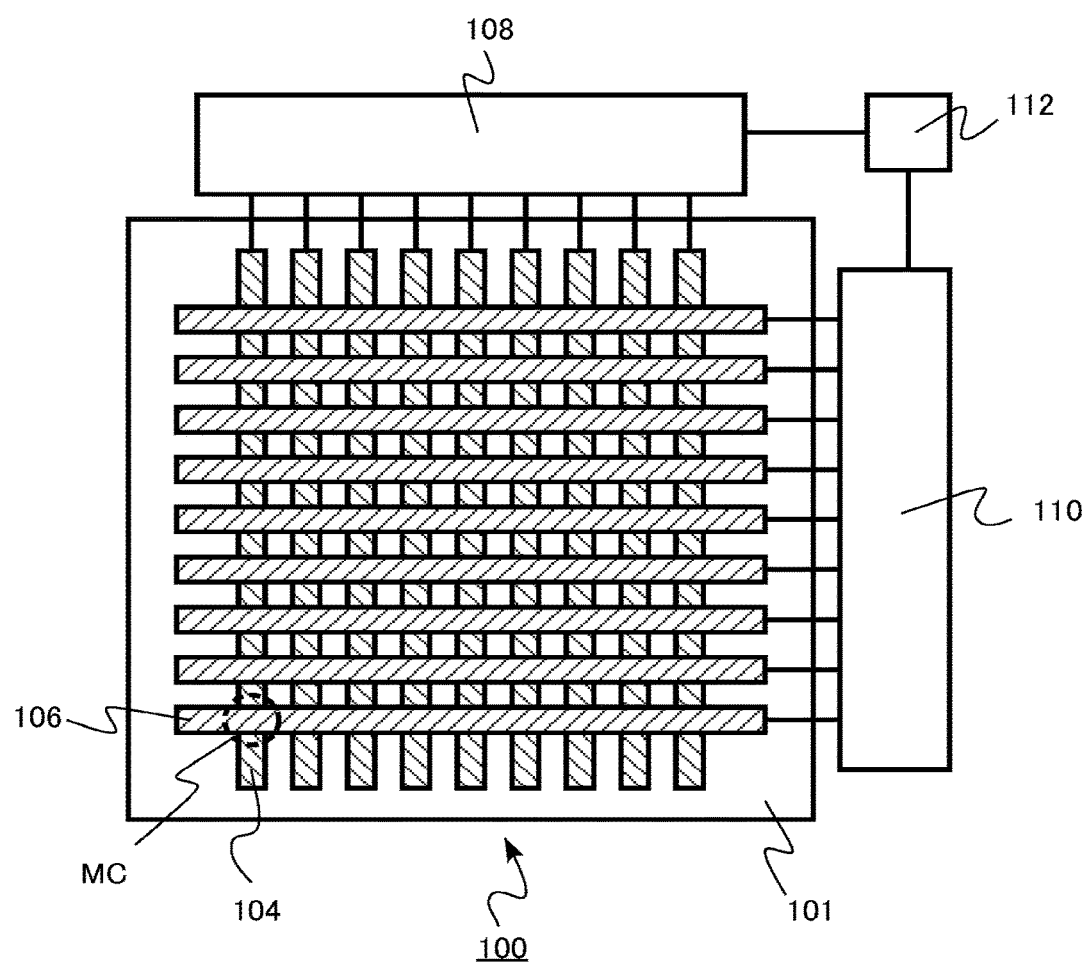
FIG. 1 is a block diagram illustrating a memory device according to a first embodiment.

A memory device according to an embodiment includes: a first conductive layer; a second conductive layer; a first metal oxide layer that is provided between the first conductive layer and the second conductive layer and includes at least one first metal element selected from the group consisting of aluminum (Al), gallium (Ga), zirconium (Zr), and hafnium (Hf); and a second metal oxide layer that is provided between the first metal oxide layer and the second conductive layer and includes at least one second metal element selected from the group consisting of zinc (Zn), titanium (Ti), tin (Sn), vanadium (V), niobium (Nb), tantalum (Ta), and tungsten (W). The first metal oxide layer includes a third metal element. The third metal element has a lower valence than a metal element having the highest atomic percent in the first metal oxide layer among the at least one first metal element.

Hereinafter, embodiments of the disclosure will be described with reference to the drawings. In the following description, for example, the same or similarly members denoted by the same reference numerals and the description thereof will not be repeated.

Hereinafter, the memory device according to embodiments will be described with reference to the drawings.

First Embodiment

A memory device according to this embodiment includes: a first conductive layer; a second conductive layer; a first metal oxide layer that is provided between the first conductive layer and the second conductive layer and includes at least one first metal element selected from the group consisting of aluminum (Al), gallium (Ga), zirconium (Zr), and hafnium (Hf); and a second metal oxide layer that is provided between the first metal oxide layer and the second conductive layer and includes at least one second metal element selected from the group consisting of zinc (Zn), titanium (Ti), tin (Sn), vanadium (V), niobium (Nb), tantalum (Ta), and tungsten (W). The first metal oxide layer includes a third metal element. The third metal element has a lower valence than a metal element having the highest atomic percent in the first metal oxide layer among the at least one first metal element.

Figure 2:
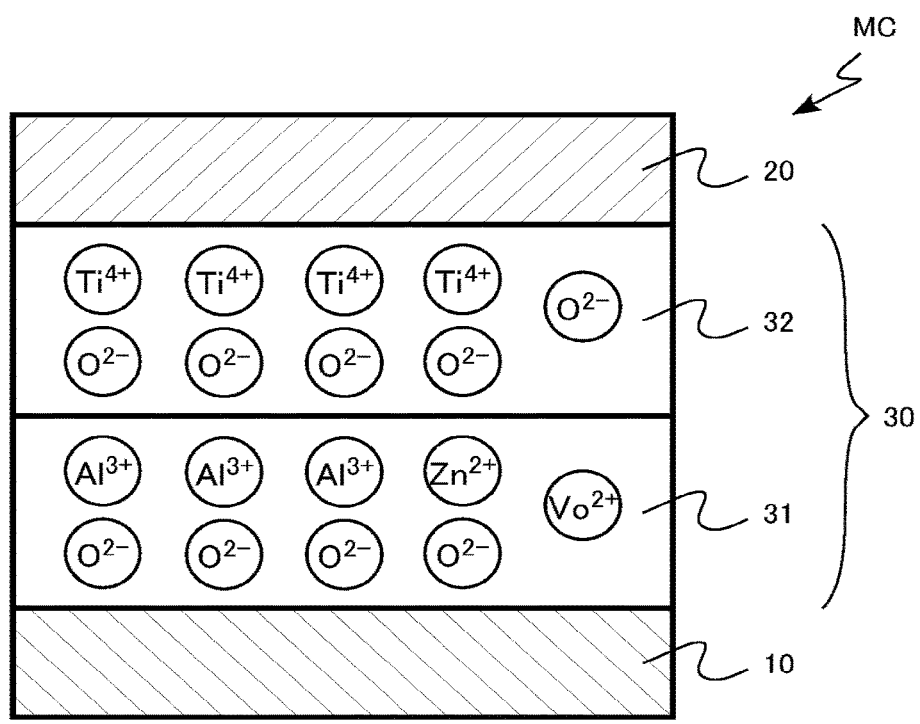
FIG. 2 is a cross-sectional view schematically illustrating a memory cell of the memory device according to the first embodiment.

FIG. 1 is a block diagram illustrating a memory cell array 100 and peripheral circuits of the memory device according to this embodiment. FIG. 2 is a cross-sectional view schematically illustrating a memory cell MC of the memory device according to this embodiment. FIG. 2 illustrates, for example, the cross section of one memory cell MC which is represented by a dotted circle in the memory cell array 100 illustrated in FIG. 1.

The memory cell array 100 of the memory device according to this embodiment includes, for example, a plurality of word lines 104 (first lines) and a plurality of bit lines 106 (second lines) intersecting the word lines 104. The word lines 104 and the bit lines 106 are provided above the semiconductor substrate 101, with an insulating layer interposed therebetween. The bit lines 106 are provided above the word lines 104. In addition, a first control circuit 108, a second control circuit 110, and a sense circuit 112 are provided as the peripheral circuits around the memory cell array 100.

A plurality of memory cells MC are provided in regions in which the word lines 104 and the bit lines 106 intersect each other. The memory device according to this embodiment is a variable resistance memory having a cross-point structure. The memory cell MC is a variable resistance element with two terminals.

Each of the plurality of word lines 104 is connected to the first control circuit 108. In addition, each of the plurality of bit lines 106 is connected to the second control circuit 110. The sense circuit 112 is connected to the first control circuit 108 and the second control circuit 110.

The first control circuit 108 and the second control circuit 110 have, for example, a function which selects a desired memory cell MC, writes data to the memory cell MC, reads data from the memory cell MC, and erases data in the memory cell MC. When data is read, data in the memory cell is read as the amount of current flowing between the word line 104 and the bit line 106. The sense circuit 112 has a function which determines the amount of current and determines the polarity of data. For example, the sense circuit 112 determines whether data is "0" or "1".

The first control circuit 108, the second control circuit 110, and the sense circuit 112 are, for example, electronic circuits using semiconductor devices which are formed on the semiconductor substrate 101.

As illustrated in FIG. 2, the memory cell MC includes a lower electrode 10 (first conductive layer), an upper electrode 20 (second conductive layer), and a variable resistance layer 30. FIG. 2 illustrates an example of elements and oxygen vacancies included in the variable resistance layer 30.

The lower electrode 10 is connected to the word line 104. The lower electrode 10 is made of, for example, metal. The lower electrode 10 is made of, for example, titanium (Ti), tungsten (W), tantalum (Ta), platinum (Pt), or an oxide thereof. The lower electrode 10 is made of, for example, titanium nitride. The lower electrode 10 may be a portion of the word line 104.

The upper electrode 20 is connected to the bit line 106. The upper electrode 20 made of, for example, metal. The upper electrode 20 is made of, for example, titanium (Ti), tungsten (W), tantalum (Ta), platinum (Pt), or an oxide thereof. The upper electrode 20 is made of, for example, titanium nitride. The upper electrode 20 may be a portion of the bit line 106.

The variable resistance layer 30 is provided between the lower electrode 10 and the upper electrode 20. The variable resistance layer 30 includes a first metal oxide layer 31 and a second metal oxide layer 32. The thickness of the variable resistance layer 30 is, for example, equal to or greater than 1 nm and equal to or less than 40 nm.

The first metal oxide layer 31 includes at least one first metal element selected from the group consisting of aluminum (Al), gallium (Ga), zirconium (Zr), and hafnium (Hf). The first metal oxide layer 31 has, for example, an oxide of the first metal element as a main component. The first metal oxide layer 31 is, for example, an aluminum oxide layer.

The mole fraction of the oxide of the first metal element is higher than the mole fraction of each metal oxide other than the oxide of the first metal element in the first metal oxide layer 31. The mole fraction of the oxide of the first metal element in the first metal oxide layer 31 is, for example, equal to or greater than 40%.

The first metal element is a main metal element in the first metal oxide layer 31. Among the metal elements included in the first metal oxide layer 31, the atomic percent (atomic percentage) of the first metal element is the highest. For example, the atomic percent of the first metal element among the metal elements is equal to or greater than 40%.

The thickness of the first metal oxide layer 31 is, for example, equal to or greater than 0.5 nm and equal to or less than 10 nm.

The second metal oxide layer 32 is provided between the first metal oxide layer 31 and the upper electrode 20. The second metal oxide layer 32 includes at least one second metal element selected from the group consisting of zinc (Zn), titanium (Ti), tin (Sn), vanadium (V), niobium (Nb), tantalum (Ta), and tungsten (W). The second metal oxide layer 32 has, for example, an oxide of the second metal element as a main component. The second metal oxide layer 32 is, for example, a titanium oxide layer. The titanium oxide layer is, for example, an anatase titanium oxide layer.

The mole fraction of the oxide of the second metal element is higher than the mole fraction of each metal oxide other than the oxide of the second metal element in the second metal oxide layer 32. The mole fraction of the oxide of the second metal element in the second metal oxide layer 32 is, for example, equal to or greater than 40%.

The second metal element is a main metal element in the second metal oxide layer 32. Among the metal elements included in the second metal oxide layer 32, the atomic percent of the second metal element is the highest. For example, the atomic percent of the second metal element among the metal elements is equal to or greater than 40%.

For example, the oxide of the first metal element has a wider bandgap than the oxide of the second metal element. For example, while the oxide of the second metal element has semiconducting properties, the oxide of the first metal element has insulating properties. The resistivity of the first metal oxide layer 31 is, for example, higher than the resistivity of the second metal oxide layer 32.

The thickness of the second metal oxide layer 32 is, for example, equal to or greater than 0.5 nm and equal to or less than 10 nm.

The first metal oxide layer 31 includes a third metal element. The third metal element has a lower valence than the first metal element. When a plurality of kinds of first metal elements are included in the first metal oxide layer 31, the valence of the third metal element is compared with the valence of the first metal element having the highest atomic percent in the first metal oxide layer 31. The third metal element is, for example, at least one metal element selected from the group consisting of aluminum (Al), gallium (Ga), zirconium (Zr), hafnium (Hf), zinc (Zn), titanium (Ti), tin (Sn), vanadium (V), niobium (Nb), tantalum (Ta), and tungsten (W).

In the specification, the valences of the metal elements are defined as follows: zinc (Zn) is a divalent (2+) element; aluminum (Al) and gallium (Ga) are trivalent (3+) elements; titanium (Ti), tin (Sn), zirconium (Zr), and hafnium (Hf) are tetravalent (4+) elements; vanadium (V), niobium (Nb), and tantalum (Ta) are pentavalent (5+) elements; and tungsten is a hexavalent (6+) element.

Among the metal elements included in the first metal oxide layer 31, the atomic percent of the third metal element is lower than the atomic percent of the first metal element. The atomic percent of the third metal element is, for example, equal to or greater than 1 at % and equal to or less than 25 at %.

Next, an example in which the first metal element is trivalent aluminum (Al), the second metal element is tetravalent titanium (Ti), and the third metal element is divalent zinc (Zn) will be described. The first metal oxide layer 31 is an aluminum oxide layer and the second metal oxide layer 32 is a titanium oxide layer.

As illustrated in FIG. 2, the aluminum oxide layer which is the first metal oxide layer 31 includes zinc (Zn). Zinc substitutes aluminum in the aluminum oxide layer.

The identification of the kind of metal oxide included in the metal oxide layer or the measurement of the mole fractions of the metal oxides and the magnitude relationship between the mole fractions can be performed by, for example, X-ray photoemission spectroscopy (XPS) and an X-ray diffraction (XRD) method. The identification of the metal elements included in the metal oxide layer or the measurement of the atomic percent of the metal element and the magnitude relationship between the atomic percents can be performed by, for example, energy dispersive X-ray spectroscopy (EDX), an atom probe method, and electron energy loss spectroscopy (EELS).

Next, an example of a method for manufacturing the memory device according to this embodiment will be described.

The lower electrode 10, an aluminum oxide layer which is the first metal oxide layer 31, a titanium oxide layer which is the second metal oxide layer 32, and the upper electrode 20 are formed in this order.

The aluminum oxide layer and the titanium oxide layer are formed by, for example, a chemical vapor deposition method (CVD method), a sputtering method, or anatomic layer deposition method (ALD method).

For example, when the aluminum oxide layer is formed by the sputtering method, zinc is added to the aluminum oxide layer using a sputtering target including zinc. For example, when the aluminum oxide layer is formed by the ALD method, for example, an aluminum film and a zinc film are alternately stacked to add zinc to the aluminum oxide layer.

Next, the function and effect of the memory device according to this embodiment will be described.

Figure 3:
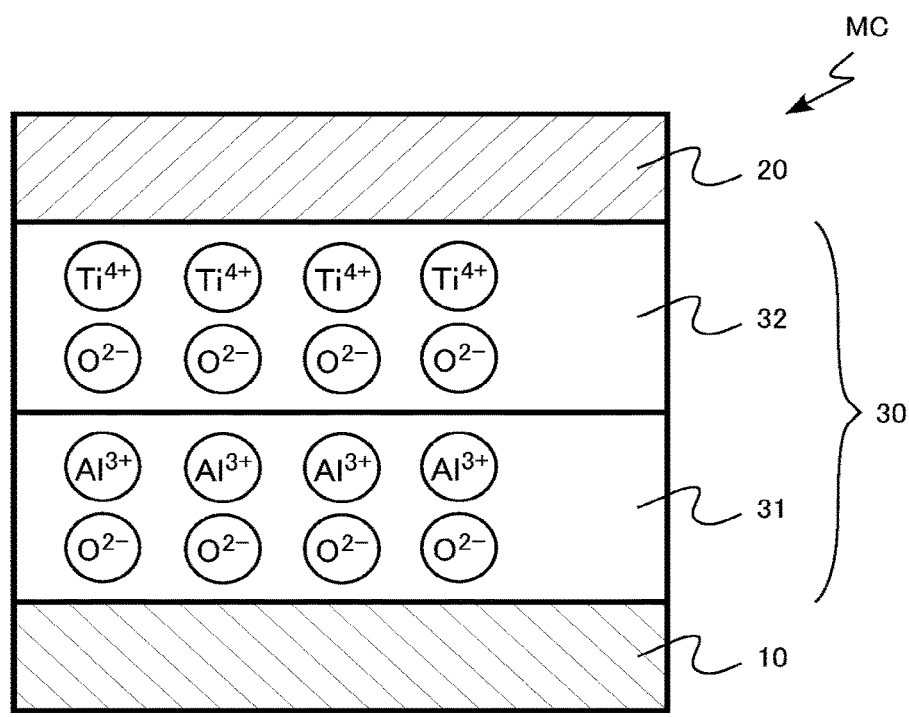
FIG. 3 is a cross-sectional view schematically illustrating a memory cell of a memory device according to a comparative example.

FIG. 3 is a cross-sectional view schematically illustrating a memory cell of a memory device according to a comparative example. The memory cell includes a lower electrode 10, an upper electrode 20, and a variable resistance layer 30. The variable resistance layer 30 includes a first metal oxide layer 31 and a second metal oxide layer 32. The first metal oxide layer 31 is, for example, an aluminum oxide layer. The second metal oxide layer 32 is a titanium oxide layer.

A memory cell MC according to the comparative example differs from the memory cell MC according to this embodiment except that the first metal oxide layer 31 does not include the third element. For example, the aluminum oxide layer does not include zinc.

FIGS. 4A and 4B are diagrams illustrating the operation principle of the memory cell according to the comparative example. In the memory cell MC according to the comparative example, when a current is applied to the variable resistance layer 30, the variable resistance layer 30 is changed from a high-resistance state to a low-resistance state or from a low-resistance state to a high-resistance state. The change from the high-resistance state to the low-resistance state is referred to as, for example, a set operation. The change from the low-resistance state to the high-resistance state is referred to as, for example, a reset operation.

The high-resistance state is also referred to as an off state or a reset state. In addition, the low-resistance state is referred to as an on state or a set state. It is considered that the off state is changed to the on state by the following principle.

In the off state illustrated in FIG. 4A, oxygen vacancies (Vo in FIG. 4A) are present in the titanium oxide layer which is the second metal oxide layer 32. The following cases may be considered: a case in which the distribution of the oxygen vacancies in the titanium oxide layer is uniform; a case in which the oxygen vacancies are present only at the interface between the titanium oxide layer and the aluminum oxide layer which is the first metal oxide layer 31; and a case in which a filament is formed in the titanium oxide layer.

In the state illustrated in FIG. 4A, since no oxygen vacancies are present in the aluminum oxide layer which is the first metal oxide layer 31, the aluminum oxide layer has high resistance. Therefore, the variable resistance layer 30 has high resistance.

A negative voltage is applied to the lower electrode 10, a positive voltage is applied to the upper electrode 20, and a set voltage (Vset) is applied between the lower electrode 10 and the upper electrode 20. Then, an oxygen vacancy with positive charge is moved to the lower electrode 10. In other words, oxygen with negative charge is moved to the upper electrode 20.

As illustrated in FIG. 4B, the oxygen vacancies in the titanium oxide layer disappear with the movement of the oxygen vacancies or the movement of oxygen and oxygen vacancies occur in the aluminum oxide layer which is the first metal oxide layer 31. For example, the following cases are considered: a case in which the distribution of the oxygen vacancies in the aluminum oxide layer is uniform; a case in which the oxygen vacancies are present only at the interface between the titanium oxide layer and the aluminum oxide layer; and a case in which a filament is formed in the aluminum oxide layer.

The state illustrated in FIG. 4B is the on state. The resistance of the aluminum oxide layer which is the first metal oxide layer 31 is reduced and the variable resistance layer 30 has low resistance. It is considered that, since the second metal oxide layer 32 has a lower resistance than the first metal oxide layer 31, a change in the resistance of the variable resistance layer 30 is dominated by a change in the resistance of the first metal oxide layer 31.

The on state illustrated in FIG. 4B is maintained even when the voltage drops to 0 V. When a negative voltage is applied to the lower electrode 10, a positive voltage is applied to the upper electrode 20, and a read voltage lower than the set voltage is applied to the memory cell MC in the on state, a read current flows to the variable resistance layer 30.

In the memory cell MC in the on state illustrated in FIG. 4B, a positive voltage is applied to the lower electrode 10, a negative voltage is applied to the upper electrode 20, and a reset voltage (Vreset) is applied between the lower electrode 10 and the upper electrode 20. Then, an oxygen vacancy with positive charge is moved to the upper electrode 20. In other words, oxygen with negative charge is moved to the lower electrode 10. Therefore, the oxygen vacancies in the aluminum oxide layer which is the first metal oxide layer 31 disappear and the memory cell MC returns to the off state illustrated in FIG. 4A.

In the off state, when the read voltage is applied, only a read current which is less than that in the on state flows to the variable resistance layer 30.

For example, the off state is defined as data "0" and the on state is defined as data "1". The memory cell MC can store one set of data "0" and data "1".

The memory cell MC according to the comparative example has a vertically asymmetric layer structure. Therefore, in some cases, the set voltage which is an operating voltage required to reduce resistance is different from the reset voltage which is an operating voltage required to increase resistance. As a result, in some cases, one of the voltages does not satisfy the required voltage specifications. For this reason, a technique is required which adjusts the balance between the set voltage and the reset voltage in the memory cell MC according to the comparative example such that the required voltage specifications are satisfied.

Both the set operation and the reset operation of the memory cell MC are the movement of oxygen between the first metal oxide layer 31 and the second metal oxide layer 32. Therefore, it is considered that the set voltage and the reset voltage can be adjusted by controlling the oxygen affinity of the first metal oxide layer 31 or the second metal oxide layer 32.

For example, an operation of reducing the oxygen affinity of the first metal oxide layer 31 is performed, an operation of increasing the oxygen affinity of the second metal oxide layer 32 is performed, or two operations are performed at the same time. In this case, it becomes easy for the oxygen to move from the first metal oxide layer 31 to the second metal oxide layer 32. Therefore, the set voltage is reduced.

In contrast, an operation of increasing the oxygen affinity of the first metal oxide layer 31 is performed, an operation of reducing the oxygen affinity of the second metal oxide layer 32 is performed, or two operations are performed at the same time. In this case, it is easy for the oxygen to move from the second metal oxide layer 32 to the first metal oxide layer 31. Therefore, the reset voltage is reduced.

The oxygen affinity of the metal oxide layer can be changed by controlling the amount of charge in the metal oxide layer. An oxygen ion is a divalent anion. Therefore, as the amount of positive charge in the metal oxide layer increases, the oxygen affinity increases. In contrast, as the amount of negative charge in the metal oxide layer increases, the oxygen affinity decreases.

The amount of charge in the metal oxide layer is adjusted by adding an element to the metal oxide layer. For example, the amount of charge in the metal oxide layer can be adjusted by adding an element with a different valence to substitute the metal element or oxygen in the metal oxide layer.

In this embodiment, the first metal oxide layer 31 includes the third metal element. The third metal element has a lower valence than the first metal element. Specifically, for example, as illustrated in FIG. 2, divalent zinc (Zn) is included as the third metal element in the aluminum oxide layer which is the first metal oxide layer 31. Zinc substitutes trivalent aluminum in the aluminum oxide layer.

Therefore, the amount of negative charge in the first metal oxide layer 31 increases. Thus, the oxygen affinity of the first metal oxide layer 31 is reduced. As a result, the set voltage is reduced.

Preferably, the first metal element is aluminum (Al) and the second metal element is titanium (Ti). Preferably, the first metal oxide layer 31 is an aluminum oxide layer and the second metal oxide layer 32 is a titanium oxide layer.

The variable resistance layer 30 formed by combining the aluminum oxide layer and the titanium oxide layer makes it possible to achieve a stable on/off operation. In addition, the combination of the aluminum oxide layer and the titanium oxide layer has high affinity with a known semiconductor device manufacture process and makes it possible to achieve a memory device with high reliability at a low cost.

The atomic percent of the first metal element among the metal elements is preferably equal to or greater than 40°, more preferably equal to or greater than 50%, and most preferably equal to or greater than 60%. In addition, the atomic percent of the second metal element among the metal elements is preferably equal to or greater than 40°, more preferably equal to or greater than 50°, and most preferably equal to or greater than 60%. An increase in the atomic percent of the first metal element and the second metal element makes it easy to achieve a stable on/off operation.

The atomic percent of the third metal element among the metal elements included in the first metal oxide layer 31 is preferably equal to or greater than 1 at % and equal to or less than 25 at %. When the atomic percent is less than the above-mentioned range, there is a concern that the operating voltage will not be adjusted. In addition, when the atomic percent of the third metal element greater than the above-mentioned range is added, solid solubility exceeds the solid solubility limit of the first metal oxide layer 31. As a result, there is a concern that a stable on/off operation will not be achieved.

As described above, according to this embodiment, the oxygen affinity of metal oxide is controlled to achieve a variable resistance memory with an adjusted operating voltage.

Second Embodiment

A memory device according to this embodiment differs from the memory device according to the first embodiment in that the second metal oxide layer includes a third metal element and the third metal element has a lower valence than a metal element with the highest atomic percent in the second metal oxide layer among the at least one second metal element. Hereinafter, in some cases, the description of the same content as that in the first embodiment is not repeated.

Figure 5:
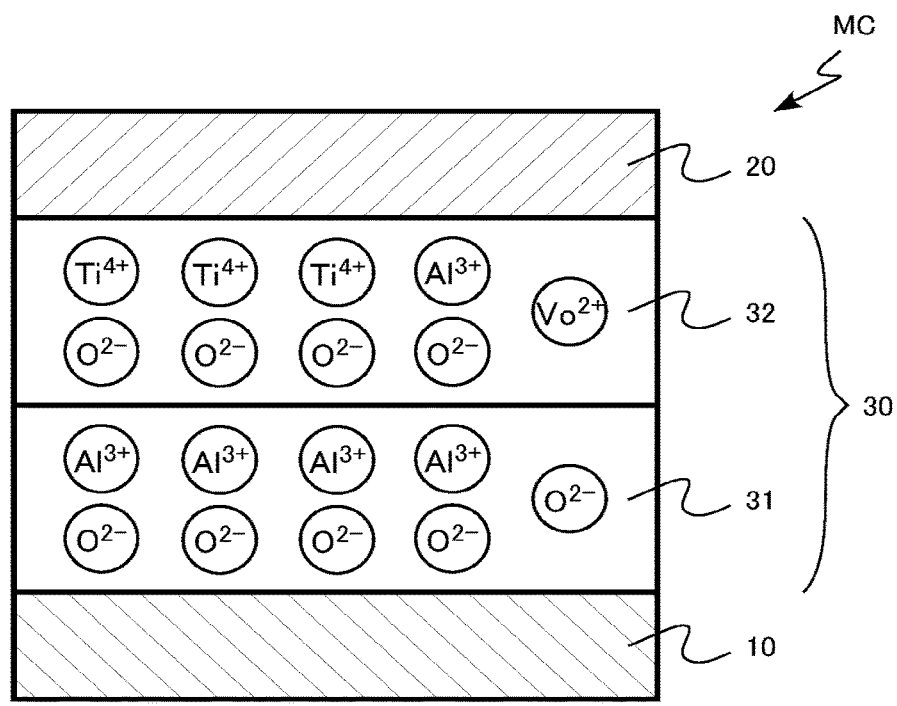
FIG. 5 is a cross-sectional view schematically illustrating a memory cell according to a second embodiment.

FIG. 5 is a cross-sectional view schematically illustrating a memory cell MC of the memory device according to this embodiment.

A second metal oxide layer 32 includes the third metal element. The third metal element has a lower valence than the second metal element. When a plurality of kinds of second metal elements are included in the second metal oxide layer 32, the valence of the third metal element is compared with the valence of a second metal element with the highest atomic percent in the second metal oxide layer 32. The third metal element is, for example, at least one metal element selected from the group consisting of aluminum (Al), gallium (Ga), zirconium (Zr), hafnium (Hf), zinc (Zn), titanium (Ti), tin (Sn), vanadium (V), niobium (Nb), tantalum (Ta), and tungsten (W).

Next, an example in which the first metal element is trivalent aluminum (Al), the second metal element is tetravalent titanium (Ti), and the third metal element is trivalent aluminum (Al) will be described. A first metal oxide layer 31 is an aluminum oxide layer and the second metal oxide layer 32 is a titanium oxide layer.

In the memory device according to this embodiment, the aluminum oxide layer and the titanium oxide layer are formed by, for example, a CVD method, a sputtering method, or an ALD method.

For example, when the titanium oxide layer is formed by the sputtering method, aluminum is added to the titanium oxide layer using a sputtering target including aluminum. For example, when the titanium oxide layer is formed by the ALD method, for example, a titanium oxide film and an aluminum film are alternately stacked to add aluminum to the titanium oxide layer.

As illustrated in FIG. 5, the titanium oxide layer which is the second metal oxide layer 32 includes aluminum (Al). Trivalent aluminum substitutes tetravalent titanium in the titanium oxide layer.

Therefore, the amount of negative charge in the second metal oxide layer 32 increases. Thus, the oxygen affinity of the second metal oxide layer 32 is reduced. As a result, a reset voltage is reduced.

As described above, according to this embodiment, similarly to the first embodiment, a variable resistance memory with an adjusted operating voltage is achieved.

Third Embodiment

A memory device according to this embodiment includes: a first conductive layer; a second conductive layer; a first metal oxide layer that is provided between the first conductive layer and the second conductive layer and includes at least one first metal element selected from the group consisting of aluminum (Al), gallium (Ga), zirconium (Zr), and hafnium (Hf); and a second metal oxide layer that is provided between the first metal oxide layer and the second conductive layer and includes at least one second metal element selected from the group consisting of zinc (Zn), titanium (Ti), tin (Sn), vanadium (V), niobium (Nb), tantalum (Ta), and tungsten (W). The first metal oxide layer includes a third metal element. The third metal element has a higher valence than a metal element having the highest atomic percent in the first metal oxide layer among the at least one first metal element.

The memory device according to this embodiment differs from the memory device according to the first embodiment in that the third metal element has a higher valence than the first metal element. Hereinafter, in some cases, the description of the same content as that in the first embodiment is not repeated.

Figure 6:
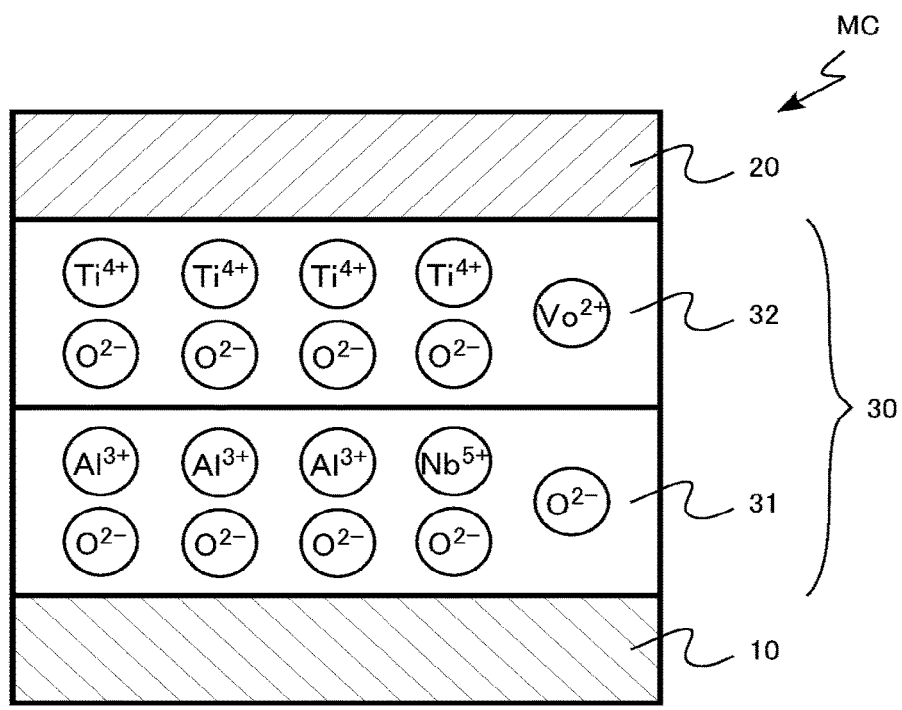
FIG. 6 is a cross-sectional view schematically illustrating a memory cell according to a third embodiment.

FIG. 6 is a cross-sectional view schematically illustrating a memory cell MC of the memory device according to this embodiment.

A first metal oxide layer 31 includes the third metal element. The third metal element has a higher valence than the first metal element. The third metal element is, for example, at least one metal element selected from the group consisting of aluminum (Al), gallium (Ga), zirconium (Zr), hafnium (Hf), zinc (Zn), titanium (Ti), tin (Sn), vanadium (V), niobium (Nb), tantalum (Ta), and tungsten (W).

Next, an example in which the first metal element is trivalent aluminum (Al), the second metal element is tetravalent titanium (Ti), and the third metal element is pentavalent niobium (Nb) will be described. The first metal oxide layer 31 is an aluminum oxide layer and a second metal oxide layer 32 is a titanium oxide layer.

As illustrated in FIG. 6, the aluminum oxide layer which is the first metal oxide layer 31 includes niobium (Nb). Pentavalent niobium substitutes trivalent aluminum in the aluminum oxide layer.

Therefore, the amount of positive charge in the first metal oxide layer 31 increases. Thus, the oxygen affinity of the first metal oxide layer 31 increases. As a result, a reset voltage is reduced.

As described above, according to this embodiment, similarly to the first embodiment, a variable resistance memory with an adjusted operating voltage is achieved.

Fourth Embodiment

A memory device according to this embodiment differs from the memory device according to the third embodiment in that the second metal oxide layer includes a third metal element and the third metal element has a higher valence than a metal element with the highest atomic percent in the second metal oxide layer among the at least one second metal element. Hereinafter, in some cases, the description of the same content as that in the third embodiment is not repeated.

Figure 7:
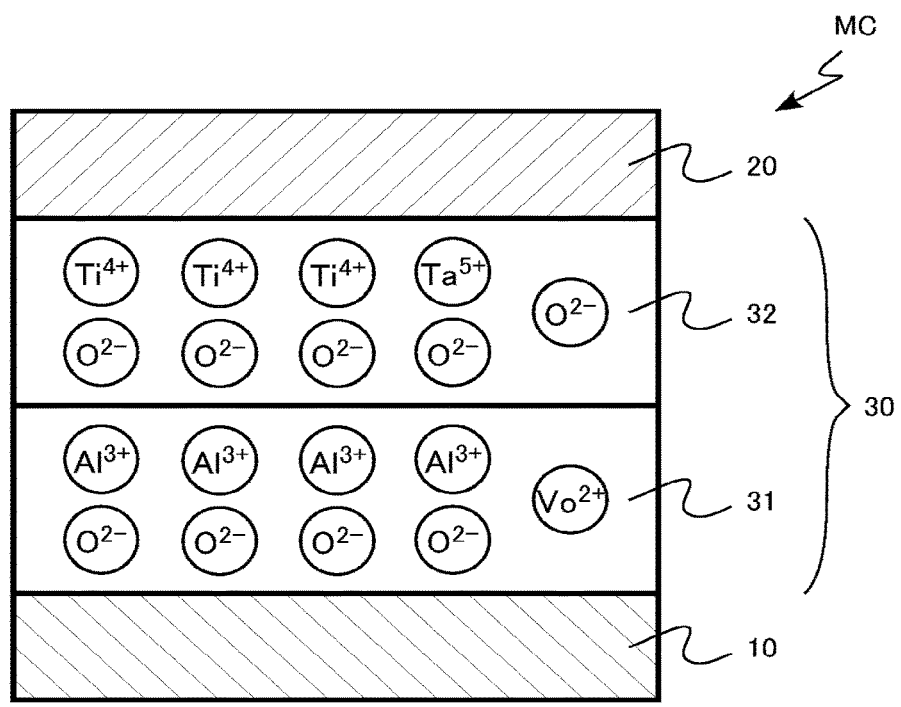
FIG. 7 is a cross-sectional view schematically illustrating a memory cell according to a fourth embodiment.

FIG. 7 is a cross-sectional view schematically illustrating a memory cell MC of the memory device according to this embodiment.

A second metal oxide layer 32 includes a third metal element. The third metal element has a higher valence than the second metal element. The third metal element is, for example, at least one metal element selected from the group consisting of aluminum (Al), gallium (Ga), zirconium (Zr), hafnium (Hf), zinc (Zn), titanium (Ti), tin (Sn), vanadium (V), niobium (Nb), tantalum (Ta), and tungsten (W).

Next, an example in which the first metal element is trivalent aluminum (Al), the second metal element is tetravalent titanium (Ti), and the third metal element is pentavalent tantalum (Ta) will be described. A first metal oxide layer 31 is an aluminum oxide layer and the second metal oxide layer 32 is a titanium oxide layer.

As illustrated in FIG. 7, the titanium oxide layer which is the second metal oxide layer 32 includes tantalum (Ta). Pentavalent tantalum substitutes tetravalent titanium in the titanium oxide layer.

Therefore, the amount of positive charge in the second metal oxide layer 32 increases. Thus, the oxygen affinity of the second metal oxide layer 32 increases. As a result, a set voltage is reduced.

As described above, according to this embodiment, similarly to the first embodiment, a variable resistance memory with an adjusted operating voltage is achieved.

Fifth Embodiment

A memory device according to this embodiment includes: a first conductive layer; a second conductive layer; a first metal oxide layer that is provided between the first conductive layer and the second conductive layer and includes a first metal element; and a second metal oxide layer that is provided between the first metal oxide layer and the second conductive layer and includes a second metal element different from the first metal element. The first metal oxide layer includes a halogen element.

The memory device according to this embodiment differs from the memory device according to the first embodiment in that the first metal oxide layer includes a halogen element. Hereinafter, in some cases, the description of the same content as that in the first embodiment is not repeated.

Figure 8:
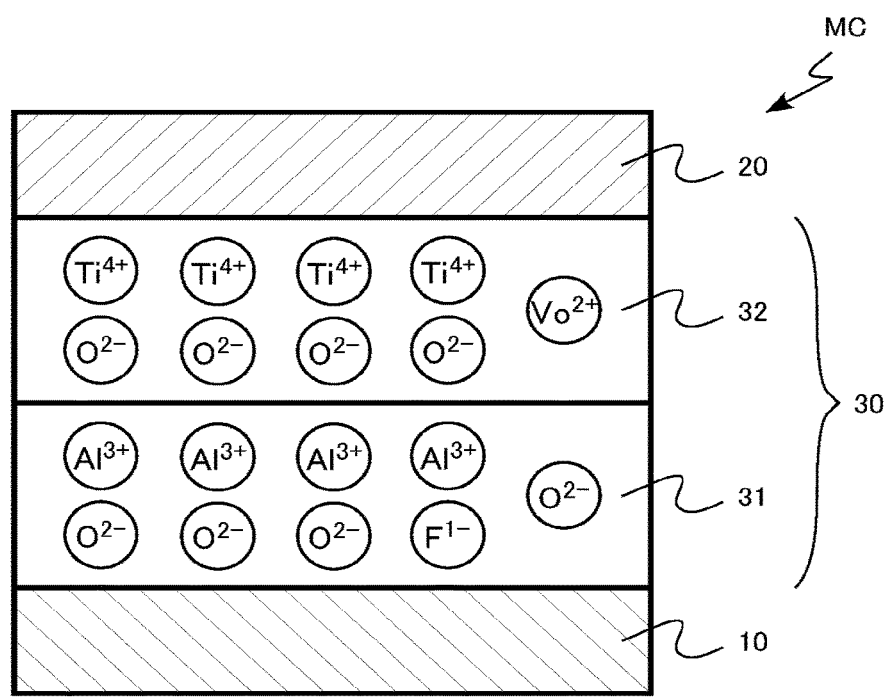
FIG. 8 is a cross-sectional view schematically illustrating a memory cell according to a fifth embodiment.

FIG. 8 is a cross-sectional view schematically illustrating a memory cell MC of the memory device according to this embodiment.

A first metal oxide layer 31 includes a halogen element. The halogen element is, for example, fluorine (F) or chlorine (Cl). The halogen element is a monovalent anion.

Next, an example in which the first metal element is trivalent aluminum (Al), the second metal element is tetravalent titanium (Ti), and the halogen element is fluorine (F) will be described. The first metal oxide layer 31 is an aluminum oxide layer and a second metal oxide layer 32 is a titanium oxide layer.

In the memory device according to this embodiment, the aluminum oxide layer and the titanium oxide layer are formed by, for example, a CVD method, a sputtering method, or an ALD method.

For example, after the aluminum oxide layer is formed, fluorine is added to the aluminum oxide layer by ion implantation.

Of oxygen and the halogen element included in the first metal oxide layer 31, the atomic percent of the halogen element is lower than the atomic percent of oxygen. The atomic percent of the halogen element is, for example, equal to or greater than 1 at % and equal to or less than 25 at %.

As illustrated in FIG. 8, the aluminum oxide layer which is the first metal oxide layer 31 includes fluorine (F). Monovalent fluorine substitutes divalent oxygen in the aluminum oxide layer.

Therefore, the amount of positive charge in the first metal oxide layer 31 increases. Thus, the oxygen affinity of the first metal oxide layer 31 increases. As a result, a reset voltage is reduced.

As described above, according to this embodiment, similarly to the first embodiment, a variable resistance memory with an adjusted operating voltage is achieved.

Sixth Embodiment

A memory device according to this embodiment differs from the memory device according to the fifth embodiment in that the second metal oxide layer includes a halogen element. Hereinafter, in some cases, the description of the same content as that in the fifth embodiment is not repeated.

Figure 9:
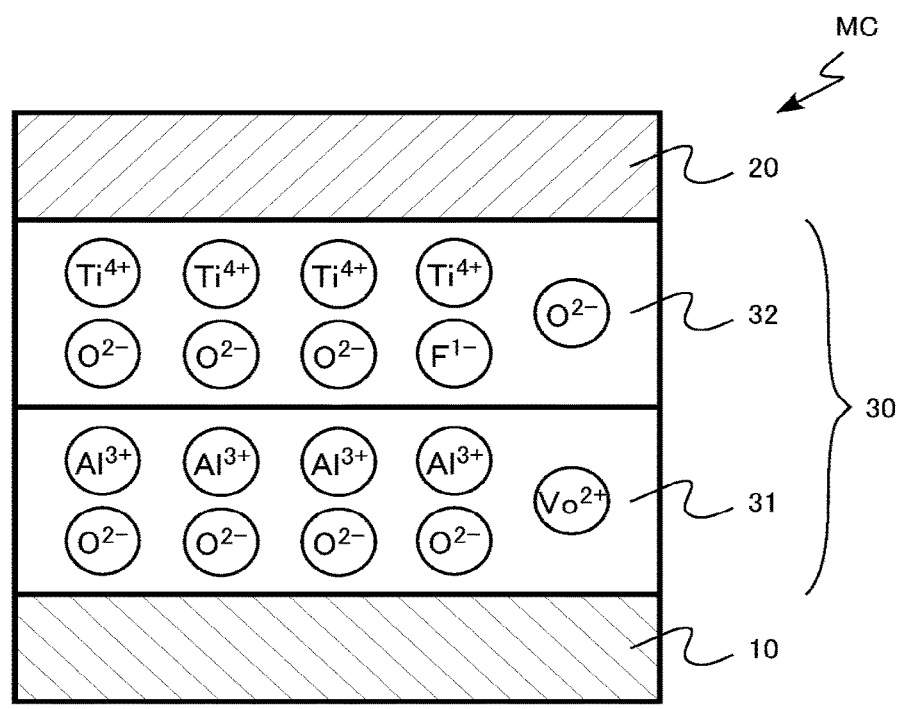
FIG. 9 is a cross-sectional view schematically illustrating a memory cell according to a sixth embodiment.

FIG. 9 is a cross-sectional view schematically illustrating a memory cell MC of the memory device according to this embodiment.

A second metal oxide layer 32 includes a halogen element. The halogen element is, for example, fluorine (F) or chlorine (Cl). The halogen element is a monovalent anion.

Next, an example in which the first metal element is trivalent aluminum (Al), the second metal element is tetravalent titanium (Ti), and the halogen element is fluorine (F) will be described. A first metal oxide layer 31 is an aluminum oxide layer and the second metal oxide layer 32 is a titanium oxide layer.

In the memory device according to this embodiment, the aluminum oxide layer and the titanium oxide layer are formed by, for example, a CVD method, a sputtering method, or an ALD method.

For example, after the titanium oxide layer is formed, fluorine is added to the titanium oxide layer by ion implantation.

Of oxygen and the halogen element included in the second metal oxide layer 32, the atomic percent of the halogen element is lower than the atomic percent of oxygen. The atomic percent of the halogen element is, for example, equal to or greater than 1 at % and equal to or less than 25 at %.

As illustrated in FIG. 9, the titanium oxide layer which is the second metal oxide layer 32 includes fluorine (F). Monovalent fluorine substitutes divalent oxygen in the titanium oxide layer.

Therefore, the amount of positive charge in the second metal oxide layer 32 increases. Thus, the oxygen affinity of the second metal oxide layer 32 increases. As a result, a set voltage is reduced.

As described above, according to this embodiment, similarly to the first embodiment, a variable resistance memory with an adjusted operating voltage is achieved.

Seventh Embodiment

A memory device according to this embodiment includes: a first conductive layer; a second conductive layer; a first metal oxide layer that is provided between the first conductive layer and the second conductive layer and includes a first metal element; and a second metal oxide layer that is provided between the first metal oxide layer and the second conductive layer and includes a second metal element different from the first metal element. The first metal oxide layer includes at least one element selected from the group consisting of nitrogen (N), phosphorus (P), and arsenic (As).

The memory device according to this embodiment differs from the memory device according to the first embodiment in that the first metal oxide layer includes at least one element selected from the group consisting of nitrogen (N), phosphorus (P), and arsenic (As). Hereinafter, in some cases, the description of the same content as that in the first embodiment is not repeated.

Figure 10:
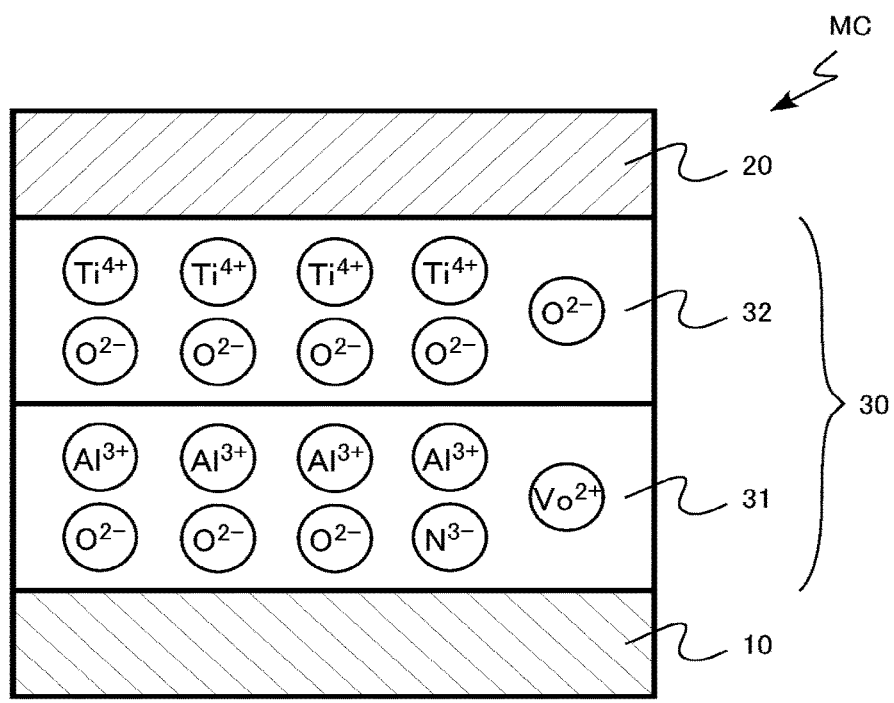
FIG. 10 is a cross-sectional view schematically illustrating a memory cell according to a seventh embodiment.

FIG. 10 is a cross-sectional view schematically illustrating a memory cell MC of the memory device according to this embodiment.

A first metal oxide layer 31 includes at least one element selected from the group consisting of nitrogen (N), phosphorus (P), and arsenic (As). Nitrogen (N), phosphorus (P), and arsenic (As) are trivalent anions.

Next, an example in which the first metal element is trivalent aluminum (Al), the second metal element is tetravalent titanium (Ti), and at least one element selected from the group consisting of nitrogen (N), phosphorus (P), and arsenic (As) is nitrogen (N) will be described. The first metal oxide layer 31 is an aluminum oxide layer and a second metal oxide layer 32 is a titanium oxide layer.

In the memory device according to this embodiment, the aluminum oxide layer and the titanium oxide layer are formed by, for example, a CVD method, a sputtering method, or an ALD method.

For example, after the aluminum oxide layer is formed, nitrogen is added to the aluminum oxide layer by ion implantation.

Of oxygen and the at least one element selected from the group consisting of nitrogen (N), phosphorus (P), and arsenic (As) which are included in the first metal oxide layer 31, the atomic percent of the at least one element selected from the group consisting of nitrogen (N), phosphorus (P), and arsenic (As) is lower than the atomic percent of oxygen. The atomic percent of the at least one element selected from the group consisting of nitrogen (N), phosphorus (P), and arsenic (As) is, for example, equal to or greater than 1 at % and equal to or less than 25 at %.

As illustrated in FIG. 10, the aluminum oxide layer which is the first metal oxide layer 31 includes nitrogen (N). Trivalent nitrogen substitutes divalent oxygen in the aluminum oxide layer.

Therefore, the amount of negative charge in the first metal oxide layer 31 increases. Thus, the oxygen affinity of the first metal oxide layer 31 is reduced. As a result, a set voltage is reduced.

As described above, according to this embodiment, similarly to the first embodiment, a variable resistance memory with an adjusted operating voltage is achieved.

Eighth Embodiment

A memory device according to this embodiment differs from the memory device according to the seventh embodiment in that the second metal oxide layer includes at least one element selected from the group consisting of nitrogen (N), phosphorus (P), and arsenic (As). Hereinafter, in some cases, the description of the same content as that in the seventh embodiment is not repeated.

Figure 11:
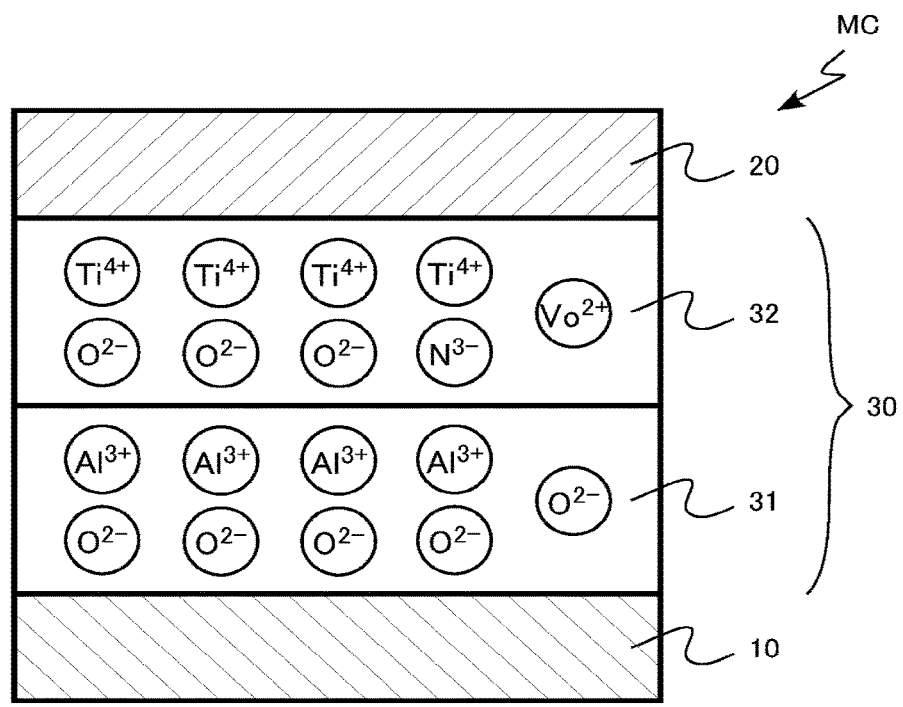
FIG. 11 is a cross-sectional view schematically illustrating a memory cell according to an eighth embodiment.

FIG. 11 is a cross-sectional view schematically illustrating a memory cell MC of the memory device according to this embodiment.

A second metal oxide layer 32 includes at least one element selected from the group consisting of nitrogen (N), phosphorus (P), and arsenic (As). Nitrogen (N), phosphorus (P), and arsenic (As) are trivalent anions.

Next, an example in which the first metal element is trivalent aluminum (Al), the second metal element is tetravalent titanium (Ti), and at least one element selected from the group consisting of nitrogen (N), phosphorus (P), and arsenic (As) is nitrogen (N) will be described. A first metal oxide layer 31 is an aluminum oxide layer and the second metal oxide layer 32 is a titanium oxide layer.

In the memory device according to this embodiment, the aluminum oxide layer and the titanium oxide layer are formed by, for example, a CVD method, a sputtering method, or an ALD method.

For example, after the titanium oxide layer is formed, nitrogen is added to the titanium oxide layer by ion implantation.

Of oxygen and the at least one element selected from the group consisting of nitrogen (N), phosphorus (P), and arsenic (As) which are included in the second metal oxide layer 32, the atomic percent of the at least one element selected from the group consisting of nitrogen (N), phosphorus (P), and arsenic (As) is lower than the atomic percent of oxygen. The atomic percent of the at least one element selected from the group consisting of nitrogen (N), phosphorus (P), and arsenic (As) is, for example, equal to or greater than 1 at % and equal to or less than 25 at %.

As illustrated in FIG. 11, the titanium oxide layer which is the second metal oxide layer 32 includes nitrogen (N). Trivalent nitrogen substitutes divalent oxygen in the titanium oxide layer.

Therefore, the amount of negative charge in the second metal oxide layer 32 increases. Thus, the oxygen affinity of the second metal oxide layer 32 is reduced. As a result, a reset voltage is reduced.

As described above, according to this embodiment, similarly to the first embodiment, a variable resistance memory with an adjusted operating voltage is achieved.

Ninth Embodiment

A memory device according to this embodiment differs from the memory device according to the first embodiment in that the second metal oxide layer includes a fourth metal element having a higher valence than the second metal element. Hereinafter, in some cases, the description of the same content as that in the first embodiment is not repeated.

Figure 12:
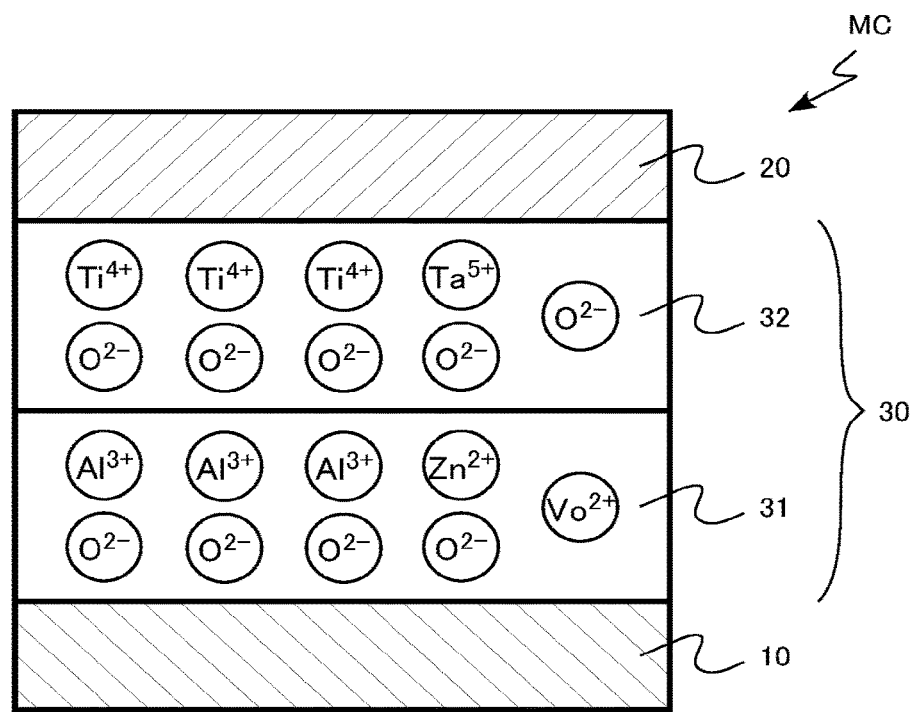
FIG. 12 is a cross-sectional view schematically illustrating a memory cell according to a ninth embodiment.

FIG. 12 is a cross-sectional view schematically illustrating a memory cell MC of the memory device according to this embodiment.

A first metal oxide layer 31 includes a third metal element. The third metal element has a lower valence than the first metal element. The third metal element is, for example, at least one metal element selected from the group consisting of aluminum (Al), gallium (Ga), zirconium (Zr), hafnium (Hf), zinc (Zn), titanium (Ti), tin (Sn), vanadium (V), niobium (Nb), tantalum (Ta), and tungsten (W).

A second metal oxide layer 32 includes a fourth metal element. The fourth metal element has a higher valence than the second metal element. The fourth metal element is at least one metal element selected from the group consisting of aluminum (Al), gallium (Ga), zirconium (Zr), hafnium (Hf), zinc (Zn), titanium (Ti), tin (Sn), vanadium (V), niobium (Nb), tantalum (Ta), and tungsten (W).

Next, an example in which the first metal element is trivalent aluminum (Al), the second metal element is tetravalent titanium (Ti), the third metal element is divalent zinc (Zn), and the fourth metal element is pentavalent tantalum (Ta) will be described. The first metal oxide layer 31 is an aluminum oxide layer and the second metal oxide layer 32 is a titanium oxide layer.

As illustrated in FIG. 12, the aluminum oxide layer which is the first metal oxide layer 31 includes zinc (Zn). Divalent zinc substitutes trivalent aluminum in the aluminum oxide layer. In addition, pentavalent tantalum substitutes tetravalent titanium in the titanium oxide layer which is the second metal oxide layer 32.

Therefore, the amount of negative charge in the first metal oxide layer 31 increases. Thus, the oxygen affinity of the first metal oxide layer 31 is reduced. In addition, the amount of positive charge in the second metal oxide layer 32 increases. Therefore, the oxygen affinity of the second metal oxide layer 32 increases. A set voltage is significantly reduced by the synergy of both.

As described above, according to this embodiment, similarly to the first embodiment, a variable resistance memory with an adjusted operating voltage is achieved. In addition, the adjustment range of the operating voltage is widened.

Tenth Embodiment

A memory device according to this embodiment differs from the memory device according to the second embodiment in that the first metal oxide layer includes a fourth metal element having a higher valence than the first metal element. Hereinafter, in some cases, the description of the same content as that in the second embodiment is not repeated.

Figure 13:
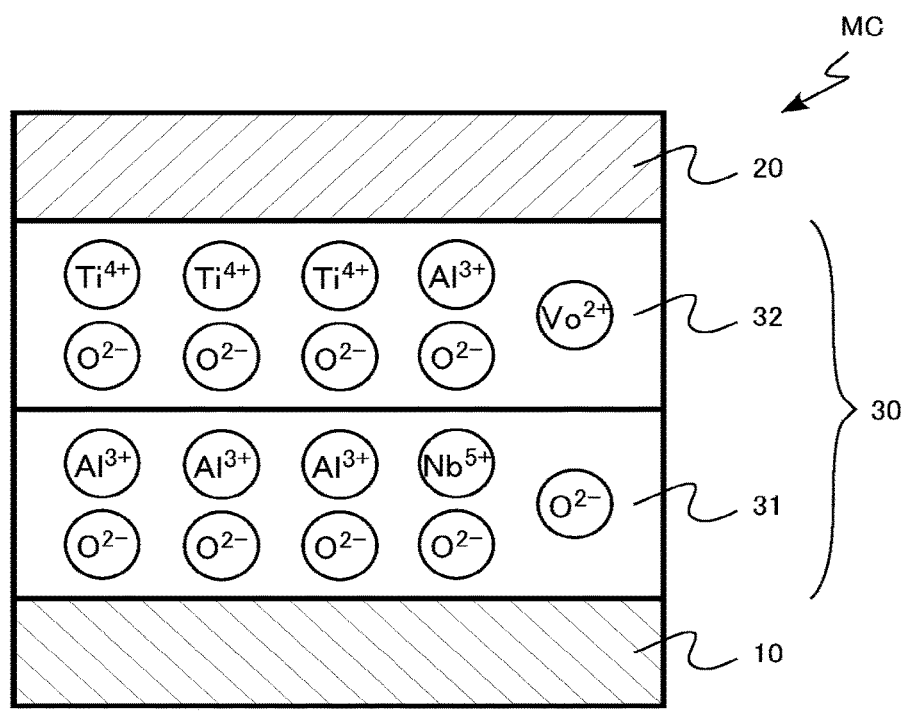
FIG. 13 is a cross-sectional view schematically illustrating a memory cell according to a tenth embodiment.

FIG. 13 is a cross-sectional view schematically illustrating a memory cell MC of the memory device according to this embodiment.

A second metal oxide layer 32 includes a third metal element. The third metal element has a lower valence than the first metal element. The third metal element is, for example, at least one metal element selected from the group consisting of aluminum (Al), gallium (Ga), zirconium (Zr), hafnium (Hf), zinc (Zn), titanium (Ti), tin (Sn), vanadium (V), niobium (Nb), tantalum (Ta), and tungsten (W).

A first metal oxide layer 31 includes a fourth metal element. The fourth metal element has a higher valence than the first metal element. The fourth metal element is at least one metal element selected from the group consisting of aluminum (Al), gallium (Ga), zirconium (Zr), hafnium (Hf), zinc (Zn), titanium (Ti), tin (Sn), vanadium (V), niobium (Nb), tantalum (Ta), and tungsten (W).

Next, an example in which the first metal element is trivalent aluminum (Al), the second metal element is tetravalent titanium (Ti), the third metal element is trivalent aluminum (Al), and the fourth metal element is pentavalent niobium (Nb) will be described. The first metal oxide layer 31 is an aluminum oxide layer and the second metal oxide layer 32 is a titanium oxide layer.

As illustrated in FIG. 13, the aluminum oxide layer which is the first metal oxide layer 31 includes niobium (Nb). Pentavalent niobium substitutes trivalent aluminum in the aluminum oxide layer. In addition, trivalent aluminum substitutes tetravalent titanium in the titanium oxide layer which is the second metal oxide layer 32.

Therefore, the amount of positive charge in the first metal oxide layer 31 increases. Thus, the oxygen affinity of the first metal oxide layer 31 increases. In addition, the amount of positive charge in the second metal oxide layer 32 is reduced. Therefore, the oxygen affinity of the second metal oxide layer 32 is reduced. A reset voltage is significantly reduced by the synergy of both.

As described above, according to this embodiment, similarly to the first embodiment, a variable resistance memory with an adjusted operating voltage is achieved. In addition, the adjustment range of the operating voltage is widened.

Eleventh Embodiment

A memory device according to this embodiment differs from the memory device according to the first embodiment in that the first metal oxide layer includes at least one element selected from the group consisting of nitrogen (N), phosphorus (P), and arsenic (As). Hereinafter, in some cases, the description of the same content as that in the first embodiment is not repeated.

Figure 14:
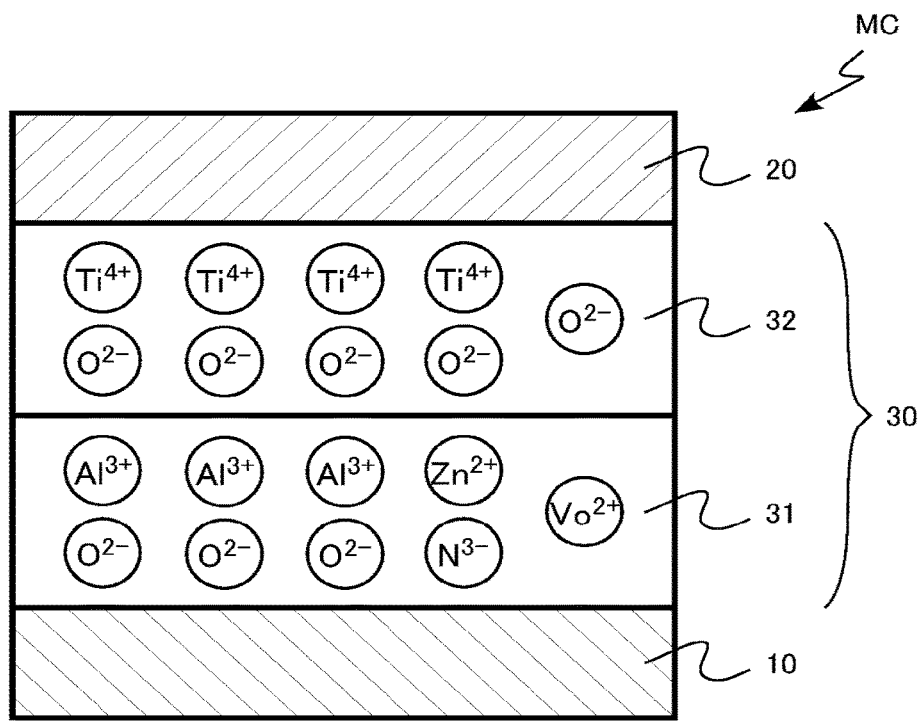
FIG. 14 is a cross-sectional view schematically illustrating a memory cell according to an eleventh embodiment.

FIG. 14 is a cross-sectional view schematically illustrating a memory cell MC of the memory device according to this embodiment.

A first metal oxide layer 31 includes a third metal element. The third metal element has a lower valence than the first metal element. The third metal element is, for example, at least one metal element selected from the group consisting of aluminum (Al), gallium (Ga), zirconium (Zr), hafnium (Hf), zinc (Zn), titanium (Ti), tin (Sn), vanadium (V), niobium (Nb), tantalum (Ta), and tungsten (W).

The first metal oxide layer 31 includes at least one element selected from the group consisting of nitrogen (N), phosphorus (P), and arsenic (As). Nitrogen (N), phosphorus (P), and arsenic (As) are trivalent anions.

Next, an example in which the first metal element is trivalent aluminum (Al), the second metal element is tetravalent titanium (Ti), the third metal element is divalent zinc (Zn), and at least one element selected from the group consisting of nitrogen (N), phosphorus (P), and arsenic (As) is nitrogen (N) will be described. The first metal oxide layer 31 is an aluminum oxide layer and a second metal oxide layer 32 is a titanium oxide layer.

As illustrated in FIG. 14, the aluminum oxide layer which is the first metal oxide layer 31 includes zinc (Zn). Divalent niobium substitutes trivalent aluminum in the aluminum oxide layer. In addition, trivalent nitrogen substitutes divalent oxygen in the aluminum oxide layer which is the first metal oxide layer 31.

Therefore, the amount of negative charge in the first metal oxide layer 31 increases significantly. Thus, the oxygen affinity of the first metal oxide layer 31 is significantly reduced. As a result, a set voltage is significantly reduced.

As described above, according to this embodiment, similarly to the first embodiment, a variable resistance memory with an adjusted operating voltage is achieved. In addition, the adjustment range of the operating voltage is widened.

Twelfth Embodiment

A memory device according to this embodiment differs from the memory device according to the first embodiment in that the second metal oxide layer includes a halogen element. Hereinafter, in some cases, the description of the same content as that in the first embodiment is not repeated.

Figure 15:
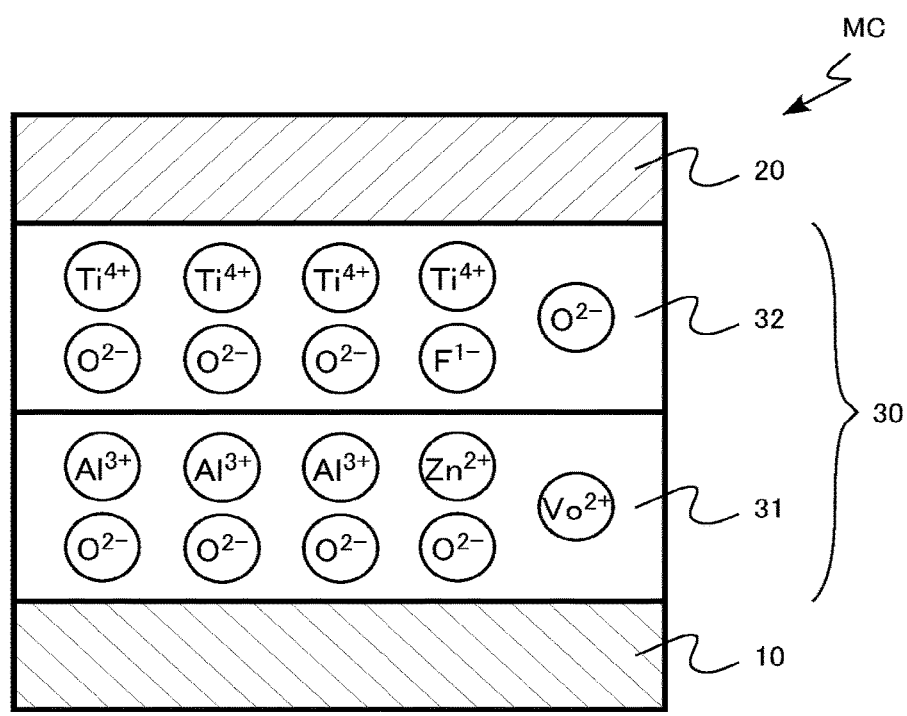
FIG. 15 is a cross-sectional view schematically illustrating a memory cell according to a twelfth embodiment.

FIG. 15 is a cross-sectional view schematically illustrating a memory cell MC of the memory device according to this embodiment.

A first metal oxide layer 31 includes a third metal element. The third metal element has a lower valence than the first metal element. The third metal element is, for example, at least one metal element selected from the group consisting of aluminum (Al), gallium (Ga), zirconium (Zr), hafnium (Hf), zinc (Zn), titanium (Ti), tin (Sn), vanadium (V), niobium (Nb), tantalum (Ta), and tungsten (W).

A second metal oxide layer 32 includes a halogen element. The halogen element is, for example, fluorine (F) or chlorine (Cl). The halogen element is a monovalent anion.

Next, an example in which the first metal element is trivalent aluminum (Al), the second metal element is tetravalent titanium (Ti), the third metal element is divalent zinc (Zn), and the halogen element is fluorine (F) will be described. The first metal oxide layer 31 is an aluminum oxide layer and the second metal oxide layer 32 is a titanium oxide layer.

As illustrated in FIG. 15, the aluminum oxide layer which is the first metal oxide layer 31 includes zinc (Zn). Divalent zinc substitutes trivalent aluminum in the aluminum oxide layer. In addition, monovalent fluorine substitutes divalent oxygen in the titanium oxide layer which is the second metal oxide layer 32.

Therefore, the amount of negative charge in the first metal oxide layer 31 increases. Thus, the oxygen affinity of the first metal oxide layer 31 is reduced. In addition, the amount of positive charge in the second metal oxide layer 32 increases. Therefore, the oxygen affinity of the second metal oxide layer 32 increases. A set voltage is significantly reduced by the synergy of both.

As described above, according to this embodiment, similarly to the first embodiment, a variable resistance memory with an adjusted operating voltage is achieved. In addition, the adjustment range of the operating voltage is widened.

Thirteenth Embodiment

A memory device according to this embodiment differs from the memory device according to the second embodiment in that the first metal oxide layer includes a halogen element. Hereinafter, in some cases, the description of the same content as that in the second embodiment is not repeated.

Figure 16:
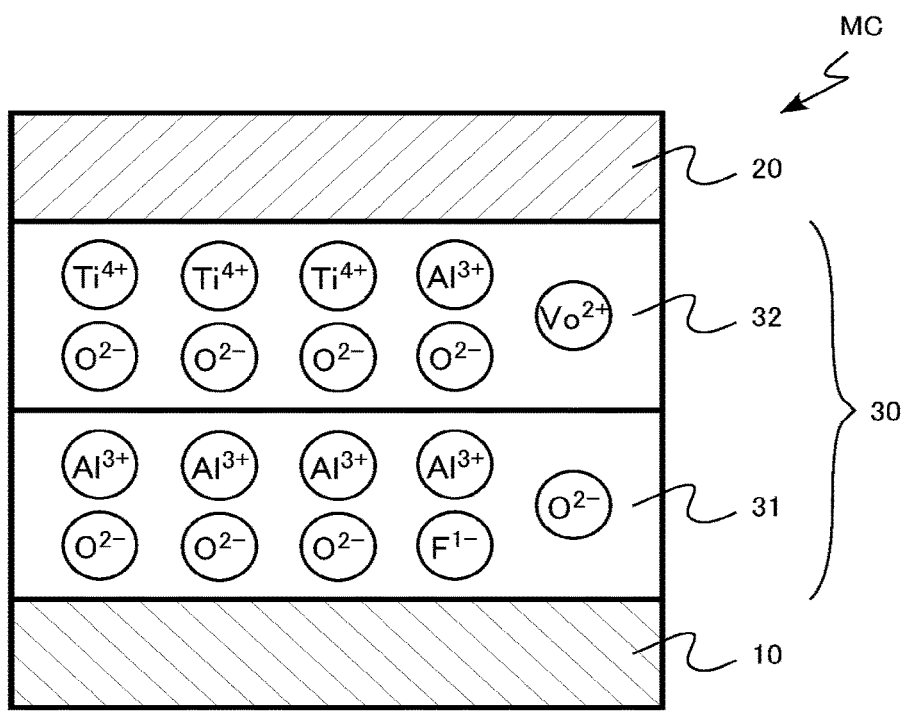
FIG. 16 is a cross-sectional view schematically illustrating a memory cell according to a thirteenth embodiment.

FIG. 16 is a cross-sectional view schematically illustrating a memory cell MC of the memory device according to this embodiment.

A second metal oxide layer 32 includes a third metal element. The third metal element has a lower valence than the first metal element. The third metal element is, for example, at least one metal element selected from the group consisting of aluminum (Al), gallium (Ga), zirconium (Zr), hafnium (Hf), zinc (Zn), titanium (Ti), tin (Sn), vanadium (V), niobium (Nb), tantalum (Ta), and tungsten (W).

A first metal oxide layer 31 includes a halogen element. The halogen element is, for example, fluorine (F) or chlorine (Cl). The halogen element is a monovalent anion.

Next, an example in which the first metal element is trivalent aluminum (Al), the second metal element is tetravalent titanium (Ti), the third metal element is trivalent aluminum (Al), and the halogen element is fluorine (F) will be described. The first metal oxide layer 31 is an aluminum oxide layer and the second metal oxide layer 32 is a titanium oxide layer.

As illustrated in FIG. 16, the aluminum oxide layer which is the first metal oxide layer 31 includes fluorine (F). Monovalent fluorine substitutes divalent oxygen in the aluminum oxide layer. In addition, trivalent aluminum substitutes tetravalent titanium in the titanium oxide layer which is the second metal oxide layer 32.

Therefore, the amount of positive charge in the first metal oxide layer 31 increases. Thus, the oxygen affinity of the first metal oxide layer 31 increases. In addition, the amount of positive charge in the second metal oxide layer 32 is reduced. Therefore, the oxygen affinity of the second metal oxide layer 32 is reduced. A reset voltage is significantly reduced by the synergy of both.

As described above, according to this embodiment, similarly to the first embodiment, a variable resistance memory with an adjusted operating voltage is achieved. In addition, the adjustment range of the operating voltage is widened.

Fourteenth Embodiment

A memory device according to this embodiment differs from the memory device according to the second embodiment in that the second metal oxide layer includes at least one element selected from the group consisting of nitrogen (N), phosphorus (P), and arsenic (As). Hereinafter, in some cases, the description of the same content as that in the second embodiment is not repeated.

Figure 17:
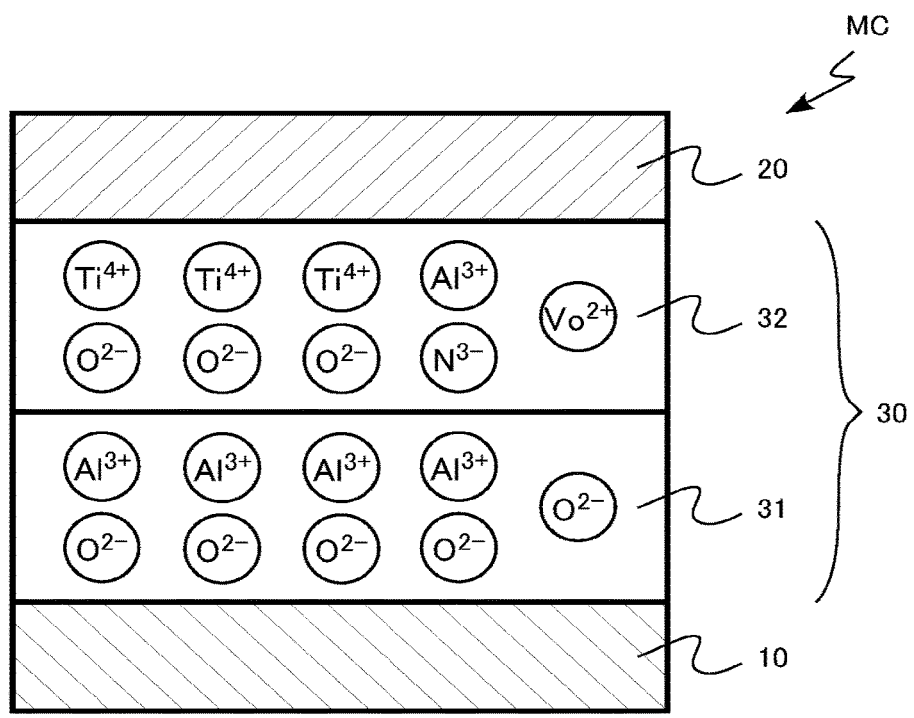
FIG. 17 is a cross-sectional view schematically illustrating a memory cell according to a fourteenth embodiment.

FIG. 17 is a cross-sectional view schematically illustrating a memory cell MC of the memory device according to this embodiment.

A second metal oxide layer 32 includes a third metal element. The third metal element has a lower valence than the first metal element. The third metal element is, for example, at least one metal element selected from the group consisting of aluminum (Al), gallium (Ga), zirconium (Zr), hafnium (Hf), zinc (Zn), titanium (Ti), tin (Sn), vanadium (V), niobium (Nb), tantalum (Ta), and tungsten (W).

The second metal oxide layer 32 includes at least one element selected from the group consisting of nitrogen (N), phosphorus (P), and arsenic (As). Nitrogen (N), phosphorus (P), and arsenic (As) are trivalent anions.

Next, an example in which the first metal element is trivalent aluminum (Al), the second metal element is tetravalent titanium (Ti), the third metal element is trivalent aluminum (Al), and at least one element selected from the group consisting of nitrogen (N), phosphorus (P), and arsenic (As) is nitrogen (N) will be described. A first metal oxide layer 31 is an aluminum oxide layer and the second metal oxide layer 32 is a titanium oxide layer.

As illustrated in FIG. 17, trivalent aluminum substitutes tetravalent titanium in the titanium oxide layer which is the second metal oxide layer 32. In addition, trivalent nitrogen substitutes divalent oxygen in the titanium oxide layer which is the second metal oxide layer 32.

Therefore, the amount of negative charge in the second metal oxide layer 32 increases significantly. Thus, the oxygen affinity of the second metal oxide layer 32 is significantly reduced. A reset voltage is significantly reduced by the synergy of both.

As described above, according to this embodiment, similarly to the first embodiment, a variable resistance memory with an adjusted operating voltage is achieved. In addition, the adjustment range of the operating voltage is widened.

Fifteenth Embodiment

A memory device according to this embodiment differs from the memory device according to the third embodiment in that the first metal oxide layer includes a halogen element. Hereinafter, in some cases, the description of the same content as that in the third embodiment is not repeated.

Figure 18:
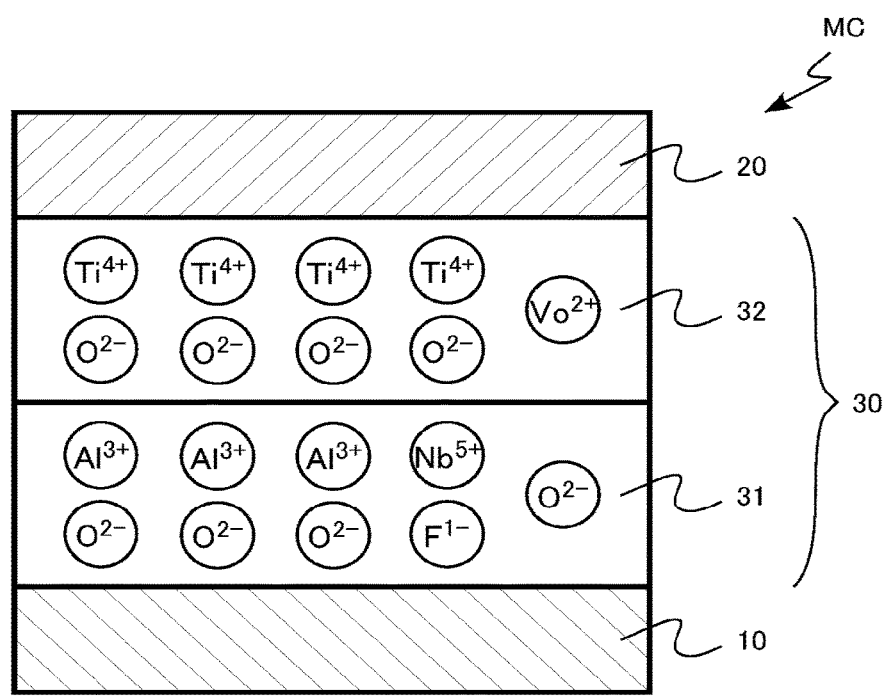
FIG. 18 is a cross-sectional view schematically illustrating a memory cell according to a fifteenth embodiment.

FIG. 18 is a cross-sectional view schematically illustrating a memory cell MC of the memory device according to this embodiment.

A first metal oxide layer 31 includes a third metal element. The third metal element has a higher valence than the first metal element. The third metal element is, for example, at least one metal element selected from the group consisting of aluminum (Al), gallium (Ga), zirconium (Zr), hafnium (Hf), zinc (Zn), titanium (Ti), tin (Sn), vanadium (V), niobium (Nb), tantalum (Ta), and tungsten (W).

The first metal oxide layer 31 includes a halogen element. The halogen element is, for example, fluorine (F) or chlorine (Cl). The halogen element is a monovalent anion.

Next, an example in which the first metal element is trivalent aluminum (Al), the second metal element is tetravalent titanium (Ti), the third metal element is pentavalent niobium (Nb), and the halogen element is fluorine (F) will be described. The first metal oxide layer 31 is an aluminum oxide layer and a second metal oxide layer 32 is a titanium oxide layer.

As illustrated in FIG. 18, the aluminum oxide layer which is the first metal oxide layer 31 includes niobium (Nb). Pentavalent niobium substitutes trivalent aluminum in the aluminum oxide layer. In addition, the aluminum oxide layer which is the first metal oxide layer 31 includes fluorine (F). Monovalent niobium substitutes divalent oxygen in the aluminum oxide layer.

Therefore, the amount of positive charge in the first metal oxide layer 31 increases significantly. Thus, the oxygen affinity of the first metal oxide layer 31 increases significantly. As a result, a reset voltage is reduced.

As described above, according to this embodiment, similarly to the first embodiment, a variable resistance memory with an adjusted operating voltage is achieved. In addition, the adjustment range of the operating voltage is widened.

Sixteenth Embodiment

A memory device according to this embodiment differs from the memory device according to the third embodiment in that the second metal oxide layer includes at least one element selected from the group consisting of nitrogen (N), phosphorus (P), and arsenic (As). Hereinafter, in some cases, the description of the same content as that in the third embodiment is not repeated.

Figure 19:
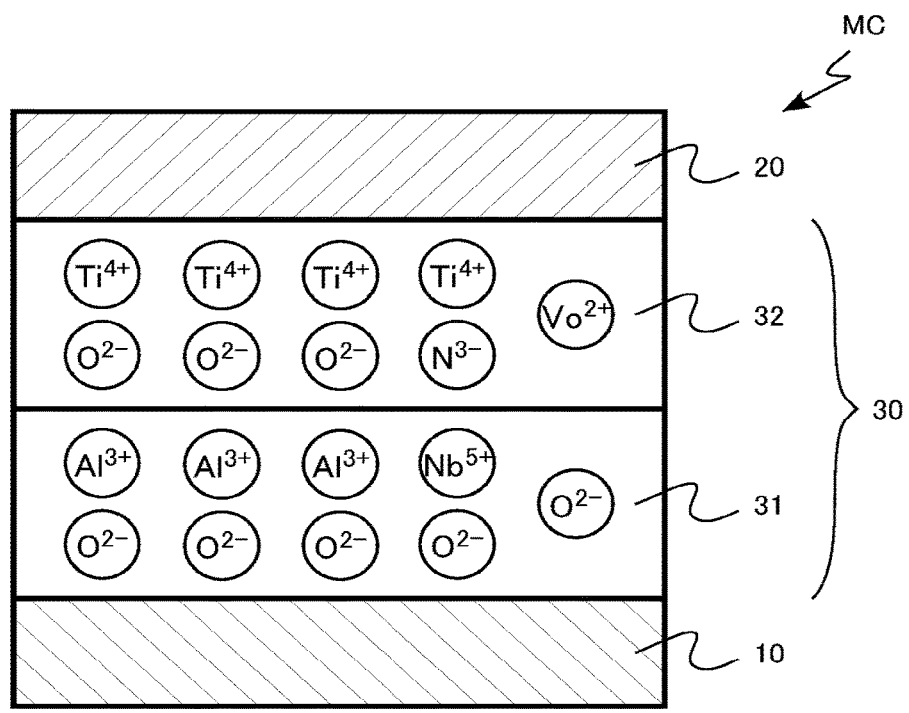
FIG. 19 is a cross-sectional view schematically illustrating a memory cell according to a sixteenth embodiment.

FIG. 19 is a cross-sectional view schematically illustrating a memory cell MC of the memory device according to this embodiment.

A first metal oxide layer 31 includes a third metal element. The third metal element has a higher valence than the first metal element. The third metal element is, for example, at least one metal element selected from the group consisting of aluminum (Al), gallium (Ga), zirconium (Zr), hafnium (Hf), zinc (Zn), titanium (Ti), tin (Sn), vanadium (V), niobium (Nb), tantalum (Ta), and tungsten (W).

A second metal oxide layer 32 includes at least one element selected from the group consisting of nitrogen (N), phosphorus (P), and arsenic (As). Nitrogen (N), phosphorus (P), and arsenic (As) are trivalent anions.

Next, an example in which the first metal element is trivalent aluminum (Al), the second metal element is tetravalent titanium (Ti), the third metal element is pentavalent niobium (Nb), and at least one element selected from the group consisting of nitrogen (N), phosphorus (P), and arsenic (As) is nitrogen (N) will be described. A first metal oxide layer 31 is an aluminum oxide layer and the second metal oxide layer 32 is a titanium oxide layer.

As illustrated in FIG. 19, the aluminum oxide layer which is the first metal oxide layer 31 includes niobium (Nb). Pentavalent niobium substitutes trivalent aluminum in the aluminum oxide layer. In addition, trivalent nitrogen substitutes divalent oxygen in the titanium oxide layer which is the second metal oxide layer 32.

Therefore, the amount of positive charge in the first metal oxide layer 31 increases. Thus, the oxygen affinity of the first metal oxide layer 31 increases. In addition, the amount of negative charge in the second metal oxide layer 32 increases. Therefore, the oxygen affinity of the second metal oxide layer 32 is reduced. A reset voltage is significantly reduced by the synergy of both.

As described above, according to this embodiment, similarly to the first embodiment, a variable resistance memory with an adjusted operating voltage is achieved. In addition, the adjustment range of the operating voltage is widened.

Seventeenth Embodiment

A memory device according to this embodiment differs from the memory device according to the fourth embodiment in that the first metal oxide layer includes at least one element selected from the group consisting of nitrogen (N), phosphorus (P), and arsenic (As). Hereinafter, in some cases, the description of the same content as that in the fourth embodiment is not repeated.

Figure 20:
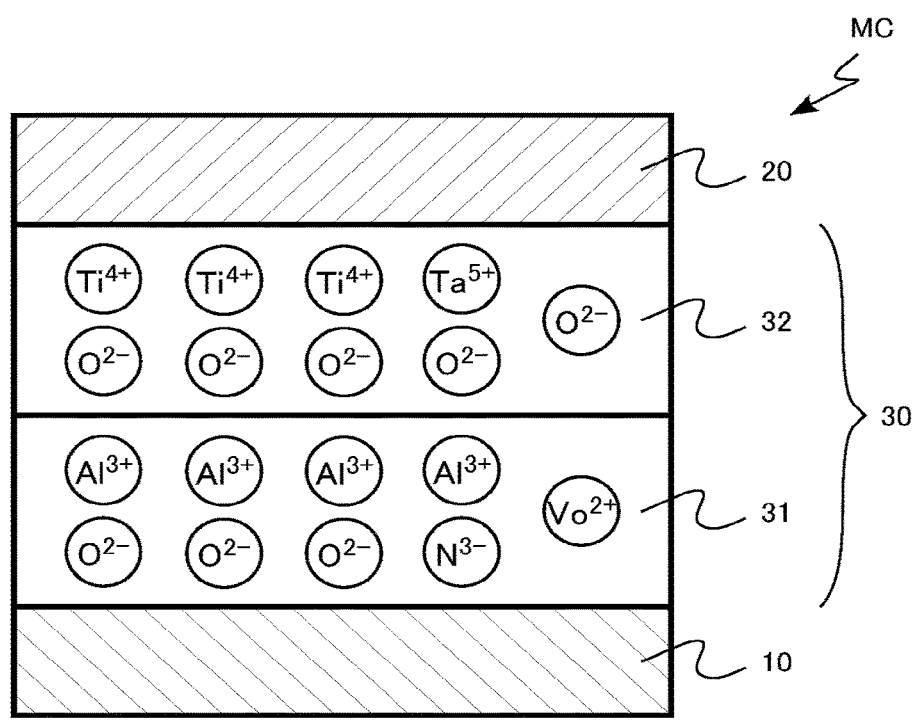
FIG. 20 is a cross-sectional view schematically illustrating a memory cell according to a seventeenth embodiment.

FIG. 20 is a cross-sectional view schematically illustrating a memory cell MC of the memory device according to this embodiment.

A second metal oxide layer 32 includes a third metal element. The third metal element has a higher valence than the second metal element. The third metal element is, for example, at least one metal element selected from the group consisting of aluminum (Al), gallium (Ga), zirconium (Zr), hafnium (Hf), zinc (Zn), titanium (Ti), tin (Sn), vanadium (V), niobium (Nb), tantalum (Ta), and tungsten (W).

A first metal oxide layer 31 includes at least one element selected from the group consisting of nitrogen (N), phosphorus (P), and arsenic (As). Nitrogen (N), phosphorus (P), and arsenic (As) are trivalent anions.

Next, an example in which the first metal element is trivalent aluminum (Al), the second metal element is tetravalent titanium (Ti), the third metal element is pentavalent tantalum (Ta), and at least one element selected from the group consisting of nitrogen (N), phosphorus (P), and arsenic (As) is nitrogen (N) will be described. The first metal oxide layer 31 is an aluminum oxide layer and the second metal oxide layer 32 is a titanium oxide layer.

As illustrated in FIG. 20, the titanium oxide layer which is the second metal oxide layer 32 includes tantalum (Ta). Pentavalent tantalum substitutes tetravalent titanium in the titanium oxide layer. In addition, the aluminum oxide layer which is the first metal oxide layer 31 includes nitrogen (N). Trivalent nitrogen substitutes divalent oxygen in the aluminum oxide layer.

Therefore, the amount of negative charge in the first metal oxide layer 31 increases. Thus, the oxygen affinity of the first metal oxide layer 31 is reduced. In addition, the amount of positive charge in the second metal oxide layer 32 increases. Therefore, the oxygen affinity of the second metal oxide layer 32 increases. A set voltage is significantly reduced by the synergy of both.

As described above, according to this embodiment, similarly to the first embodiment, a variable resistance memory with an adjusted operating voltage is achieved. In addition, the adjustment range of the operating voltage is widened.

Eighteenth Embodiment

A memory device according to this embodiment differs from the memory device according to the fourth embodiment in that the second metal oxide layer includes a halogen element. Hereinafter, in some cases, the description of the same content as that in the fourth embodiment is not repeated.

Figure 21:
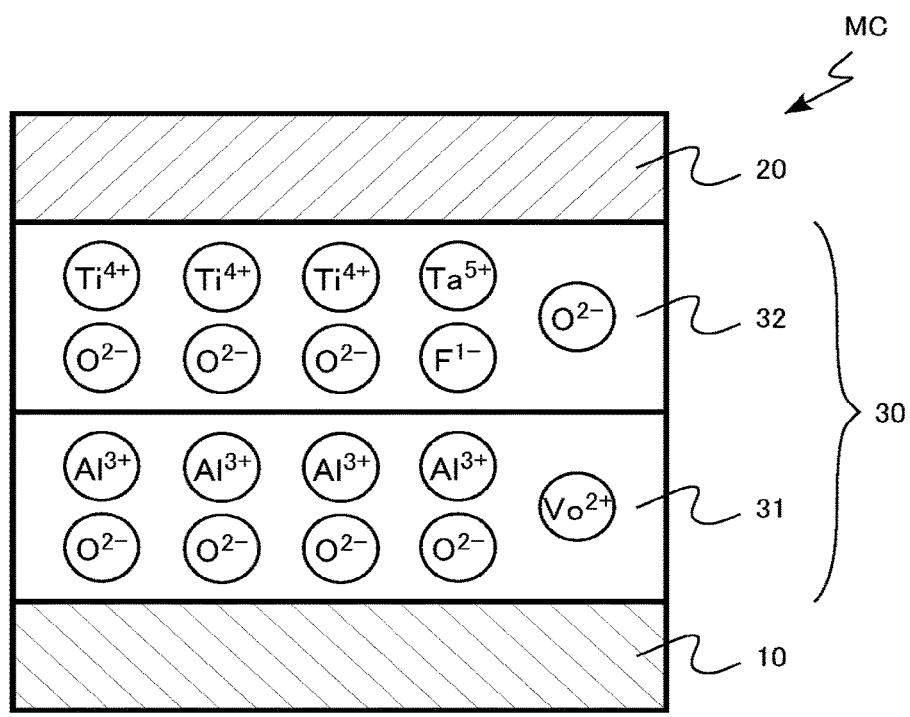
FIG. 21 is a cross-sectional view schematically illustrating a memory cell according to an eighteenth embodiment.

FIG. 21 is a cross-sectional view schematically illustrating a memory cell MC of the memory device according to this embodiment.

A second metal oxide layer 32 includes a third metal element. The third metal element has a higher valence than the second metal element. The third metal element is, for example, at least one metal element selected from the group consisting of aluminum (Al), gallium (Ga), zirconium (Zr), hafnium (Hf), zinc (Zn), titanium (Ti), tin (Sn), vanadium (V), niobium (Nb), tantalum (Ta), and tungsten (W).

The second metal oxide layer 32 includes a halogen element. The halogen element is, for example, fluorine (F) or chlorine (Cl). The halogen element is a monovalent anion.

Next, an example in which the first metal element is trivalent aluminum (Al), the second metal element is tetravalent titanium (Ti), the third metal element is pentavalent tantalum (Ta), and the halogen element is fluorine (F) will be described. A first metal oxide layer 31 is an aluminum oxide layer and the second metal oxide layer 32 is a titanium oxide layer.

As illustrated in FIG. 21, the titanium oxide layer which is the second metal oxide layer 32 includes tantalum (Ta). Pentavalent tantalum substitutes tetravalent titanium in the titanium oxide layer. In addition, monovalent fluorine substitutes divalent oxygen in the titanium oxide layer which is the second metal oxide layer 32.

Therefore, the amount of positive charge in the second metal oxide layer 32 increases significantly. Thus, the oxygen affinity of the second metal oxide layer 32 increases significantly. As a result, a reset voltage is significantly reduced.

As described above, according to this embodiment, similarly to the first embodiment, a variable resistance memory with an adjusted operating voltage is achieved. In addition, the adjustment range of the operating voltage is widened.

Nineteenth Embodiment

A memory device according to this embodiment differs from the memory device according to the fifth embodiment in that the second metal oxide layer includes at least one element selected from the group consisting of nitrogen (N), phosphorus (P), and arsenic (As). Hereinafter, in some cases, the description of the same content as that in the fifth embodiment is not repeated.

Figure 22:
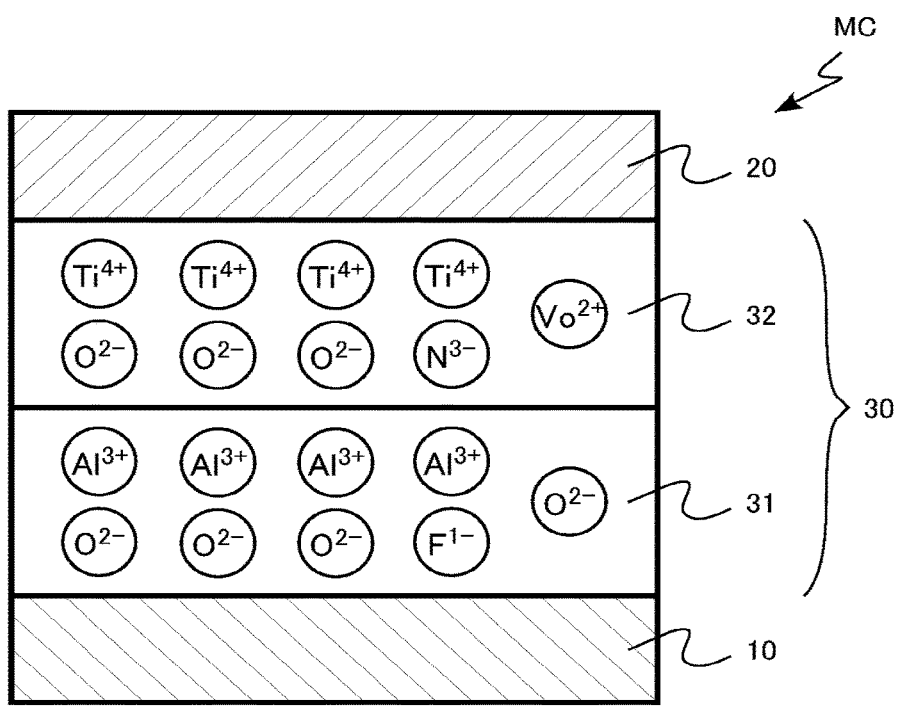
FIG. 22 is a cross-sectional view schematically illustrating a memory cell according to a nineteenth embodiment.

FIG. 22 is a cross-sectional view schematically illustrating a memory cell MC of the memory device according to this embodiment.

A first metal oxide layer 31 includes a halogen element. The halogen element is, for example, fluorine (F) or chlorine (Cl). The halogen element is a monovalent anion.

A second metal oxide layer 32 includes at least one element selected from the group consisting of nitrogen (N), phosphorus (P), and arsenic (As). Nitrogen (N), phosphorus (P), and arsenic (As) are trivalent anions.

Next, an example in which the first metal element is trivalent aluminum (Al), the second metal element is tetravalent titanium (Ti), the halogen element is fluorine (F), and at least one element selected from the group consisting of nitrogen (N), phosphorus (P), and arsenic (As) is nitrogen (N) will be described. The first metal oxide layer 31 is an aluminum oxide layer and the second metal oxide layer 32 is a titanium oxide layer.

As illustrated in FIG. 22, the aluminum oxide layer which is the first metal oxide layer 31 includes fluorine (F). Monovalent fluorine substitutes divalent oxygen in the aluminum oxide layer. In addition, the titanium oxide layer which is the second metal oxide layer 32 includes nitrogen (N). Trivalent nitrogen substitutes divalent oxygen in the titanium oxide layer.

Therefore, the amount of positive charge in the first metal oxide layer 31 increases. Thus, the oxygen affinity of the first metal oxide layer 31 increases. In addition, the amount of negative charge in the second metal oxide layer 32 increases. Therefore, the oxygen affinity of the second metal oxide layer 32 is reduced. A reset voltage is significantly reduced by the synergy of both.

As described above, according to this embodiment, similarly to the first embodiment, a variable resistance memory with an adjusted operating voltage is achieved. In addition, the adjustment range of the operating voltage is widened.

Twentieth Embodiment

A memory device according to this embodiment differs from the memory device according to the sixth embodiment in that the first metal oxide layer includes at least one element selected from the group consisting of nitrogen (N), phosphorus (P), and arsenic (As). Hereinafter, in some cases, the description of the same content as that in the sixth embodiment is not repeated.

Figure 23:
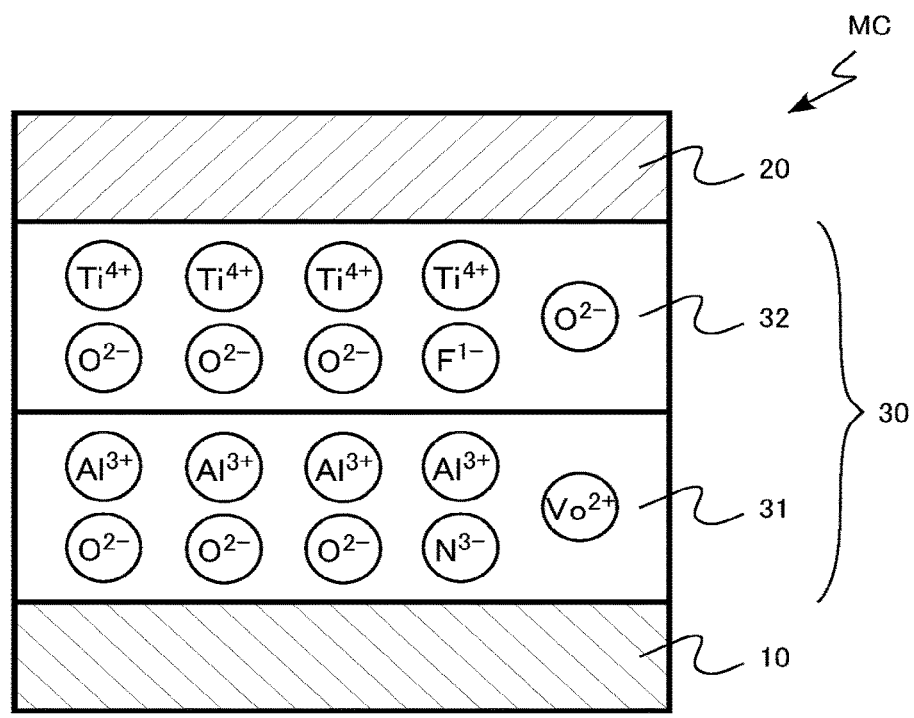
FIG. 23 is a cross-sectional view schematically illustrating a memory cell according to a twentieth embodiment.

FIG. 23 is a cross-sectional view schematically illustrating a memory cell MC of the memory device according to this embodiment.

A second metal oxide layer 32 includes a halogen element. The halogen element is, for example, fluorine (F) or chlorine (Cl). The halogen element is a monovalent anion.

A first metal oxide layer 31 includes at least one element selected from the group consisting of nitrogen (N), phosphorus (P), and arsenic (As). Nitrogen (N), phosphorus (P), and arsenic (As) are trivalent anions.

Next, an example in which the first metal element is trivalent aluminum (Al), the second metal element is tetravalent titanium (Ti) the halogen element is fluorine (F), and at least one element selected from the group consisting of nitrogen (N), phosphorus (P), and arsenic (As) is nitrogen (N) will be described. The first metal oxide layer 31 is an aluminum oxide layer and the second metal oxide layer 32 is a titanium oxide layer.

As illustrated in FIG. 23, the titanium oxide layer which is the second metal oxide layer 32 includes fluorine (F). Monovalent fluorine substitutes divalent oxygen in the titanium oxide layer. In addition, the aluminum oxide layer which is the first metal oxide layer 31 includes nitrogen (N). Trivalent nitrogen substitutes divalent oxygen in the aluminum oxide layer.

Therefore, the amount of negative charge in the first metal oxide layer 31 increases. Thus, the oxygen affinity of the first metal oxide layer 31 is reduced. In addition, the amount of positive charge in the second metal oxide layer 32 increases. Therefore, the oxygen affinity of the second metal oxide layer 32 is reduced. A set voltage is significantly reduced by the synergy of both.

As described above, according to this embodiment, similarly to the first embodiment, a variable resistance memory with an adjusted operating voltage is achieved. In addition, the adjustment range of the operating voltage is widened.

Twenty-First Embodiment

A memory device according to this embodiment differs from the memory devices according to the first to twentieth embodiments in that it further includes an amorphous silicon layer provided between the first conductive layer and the first metal oxide layer. Hereinafter, in some cases, the description of the same content as that in the first to twentieth embodiments is not repeated.

Figure 24:
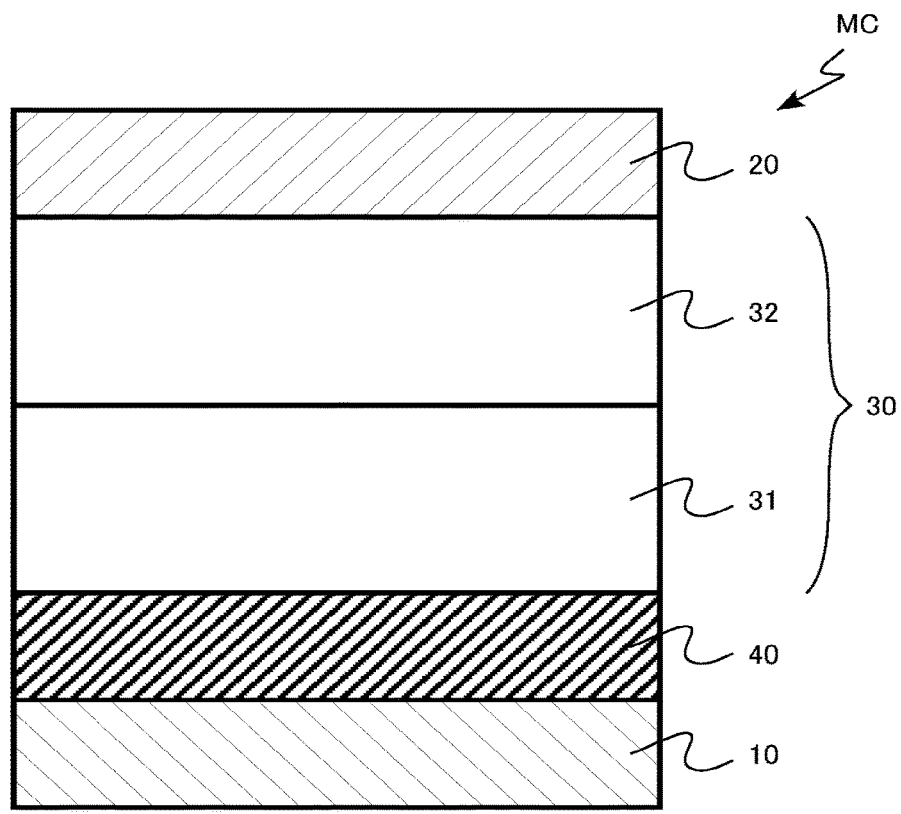
FIG. 24 is a cross-sectional view schematically illustrating a memory cell according to a twenty-first embodiment.

FIG. 24 is a cross-sectional view schematically illustrating a memory cell MC of the memory device according to this embodiment.

As illustrated in FIG. 24, the memory cell MC includes a lower electrode 10 (first conductive layer), an upper electrode 20 (second conductive layer), a variable resistance layer 30, and an amorphous silicon layer 40. The amorphous silicon layer 40 is provided between the lower electrode 10 and the variable resistance layer 30.

In the specification, amorphous silicon means silicon of which the crystal grains are not observed from an image magnified a hundred thousand times by a transmission electron microscope (TEM).

According to the variable resistance memory of this embodiment, a variation in the current that flows to the memory cell MC is prevented. Therefore, it is possible to achieve a variable resistance memory with a stable operation in addition to the effects of the first to twentieth embodiments.

Twenty-Second Embodiment

A memory device according to this embodiment differs from the memory devices according to the first to twenty-first embodiments in that the memory cell array has a three-dimensional structure. Therefore, the description of the same content as that in the first to twenty-first embodiments will not be repeated.

Figure 25:
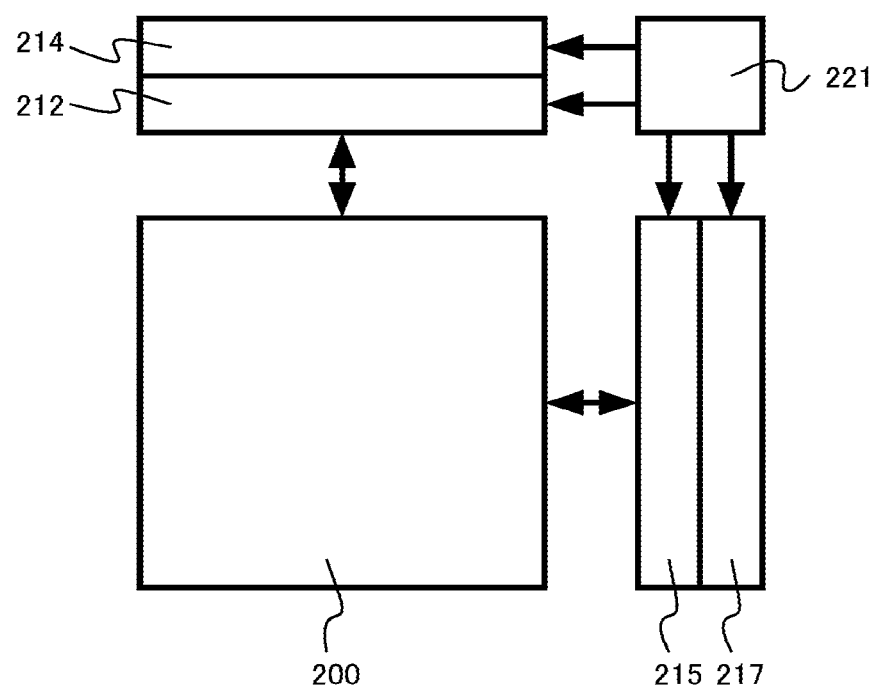
FIG. 25 is a block diagram illustrating a memory device according to a twenty-second embodiment.
Figure 26:
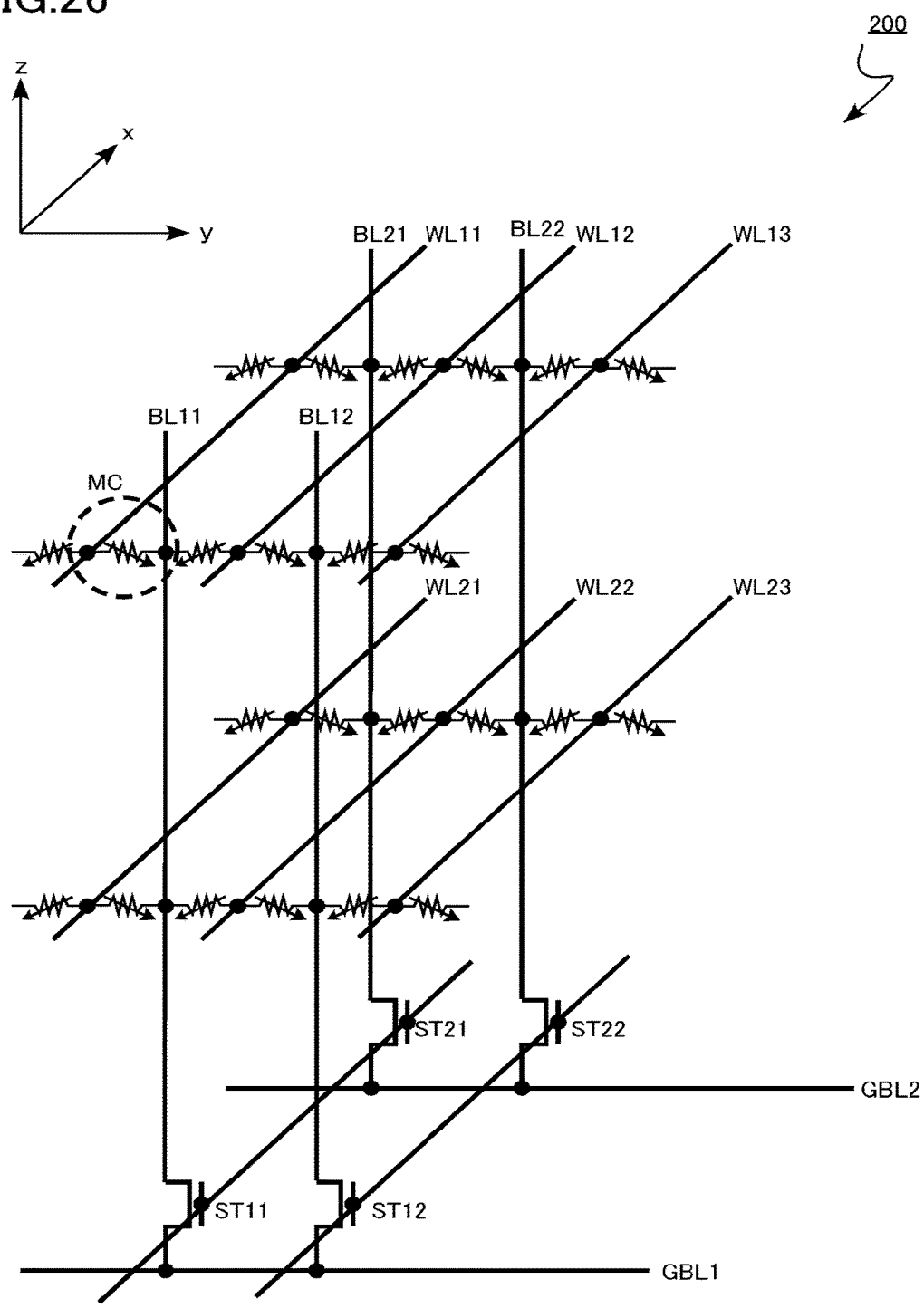
FIG. 26 is an equivalent circuit diagram illustrating a memory cell array according to the twenty-second embodiment.
Figure 27A:
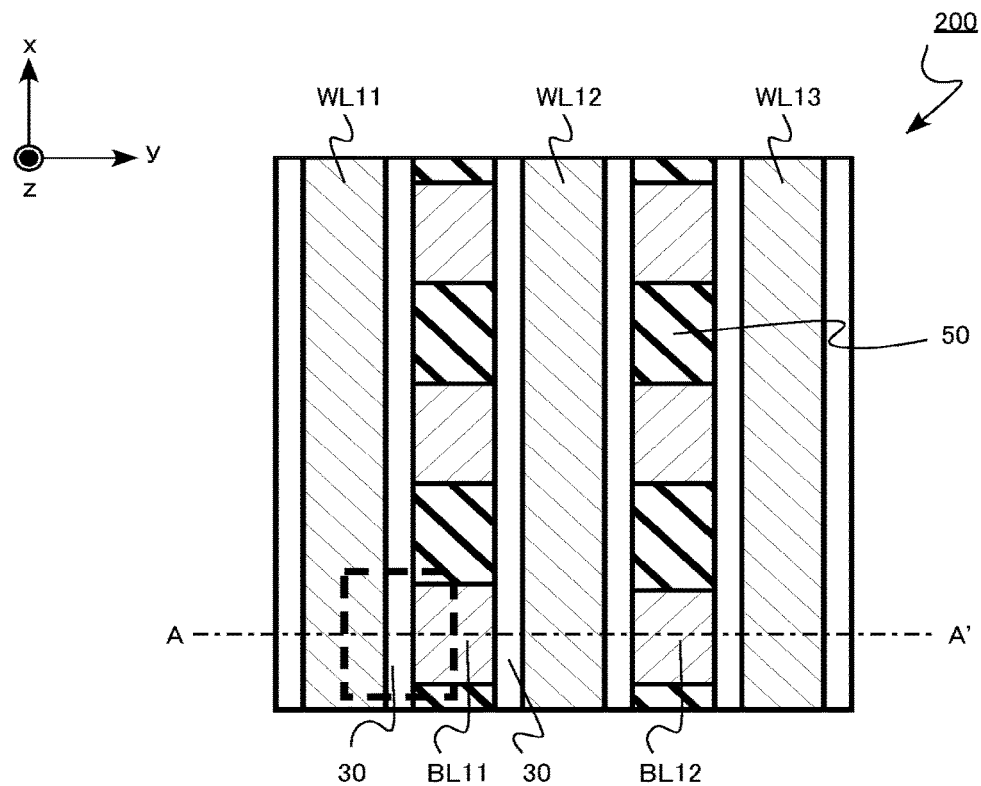
FIGS. 27A and 27B are cross-sectional views schematically illustrating the memory cell array according to the twenty-second embodiment.
Figure 27B:
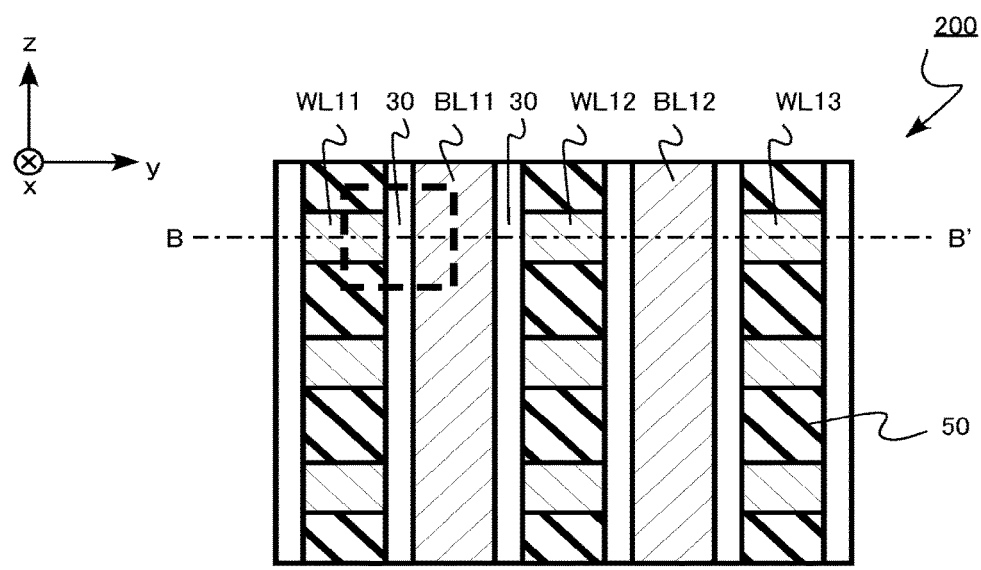

FIG. 25 is a block diagram illustrating the memory device according to this embodiment. FIG. 26 is an equivalent circuit diagram illustrating a memory cell array. FIGS. 27A and 27B are cross-sectional views schematically illustrating the memory cell array.

The memory cell array according to this embodiment has a three-dimensional structure in which memory cells MC are three-dimensionally disposed.

As illustrated in FIG. 25, the memory device includes a memory cell array 200, a word line driver circuit 212, a row decoder circuit 214, a sense amplifier circuit 215, a column decoder circuit 217, and a control circuit 221.

As illustrated in FIG. 26, a plurality of memory cells MC are three-dimensionally disposed in the memory cell array 200. In FIG. 26, a region surrounded by a dashed line corresponds to one memory cell MC.

The memory cell array 200 includes, for example, a plurality of word lines WL (WL11, WL12, WL13, WL21, WL22, and WL23) (first lines) and a plurality of bit lines BL (BL11, BL12, BL21, and BL22) (second lines). The word line WL extends in the x direction. The bit line BL extends in the z direction. The word line WL and the bit line BL perpendicularly intersect each other. The memory cell MC is disposed in an intersection portion between the word line WL and the bit line BL.

The plurality of word lines WL are electrically connected to the row decoder circuit 214. The plurality of bit lines BL are connected to the sense amplifier circuit 215. Select transistors ST (ST11, ST21, ST12, and ST22) and global bit lines GBL (GBL1 and GBL2) are provided between the plurality of bit lines BL and the sense amplifier circuit 215.

The row decoder circuit 214 has a function which selects the word line WL on the basis of an input row address signal. The word line driver circuit 212 has a function which applies a predetermined voltage to the word line WL selected by the row decoder circuit 214.

The column decoder circuit 217 has a function which selects the bit line BL on the basis of an input column address signal. The sense amplifier circuit 215 has a function which applies a predetermined voltage to the bit line BL selected by the column decoder circuit 217. In addition, the sense amplifier circuit 215 has a function which detects the current flowing between the selected word line WL and the selected bit line BL and amplifies the current.

The control circuit 221 has a function which controls the word line driver circuit 212, the row decoder circuit 214, the sense amplifier circuit 215, the column decoder circuit 217, and other circuits (not illustrated).

Circuits, such as the word line driver circuit 212, the row decoder circuit 214, the sense amplifier circuit 215, the column decoder circuit 217, and the control circuit 221, are formed by, for example, transistors using semiconductor layers (not illustrated) or wiring layers.

FIGS. 27A and 27B are cross-sectional views schematically illustrating the memory cell array 200 of the memory device according to this embodiment. FIG. 27A is an xy cross-sectional view illustrating the memory cell array 200. FIG. 27B is a yz cross-sectional view illustrating the memory cell array 200. FIG. 27A is a cross-sectional view taken along the line BB' of FIG. 27B and FIG. 27B is a cross-sectional view taken along the line AA' of FIG. 27A. In FIGS. 27A and 27B, a region surrounded by a dashed line corresponds to one memory cell MC.

The memory cell array 200 includes the word line WL11, the word line WL12, the word line WL13, the bit line BL11, and the bit line BL12. In addition, the memory cell array 200 includes a variable resistance layer 30 and an interlayer insulating layer 50. The variable resistance layer 30 according to one of the first to twenty-first embodiments may be applied to the variable resistance layer 30.

According to this embodiment, since the memory device has a three-dimensional structure, it is possible to obtain the effect of improving the degree of integration of the memory device, in addition to the effects of the first to twenty-first embodiments.

While certain embodiments have been described, these embodiments have been presented by way of example only, and are not intended to limit the scope of the inventions. Indeed, the memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

Clause 1. A memory device comprising:
a first conductive layer;
a second conductive layer;
a first metal oxide layer provided between the first conductive layer and the second conductive layer, the first metal oxide layer including a first metal element; and
a second metal oxide layer provided between the first metal oxide layer and the second conductive layer, the second metal oxide layer including a second metal element different from the first metal element,
wherein the first metal oxide layer includes a halogen element.

Clause 2. The memory device according to clause 1,
wherein the second metal oxide layer includes at least one element selected from the group consisting of nitrogen (N), phosphorus (P), and arsenic (As).

Clause 3. A memory device comprising:

a first conductive layer;

a second conductive layer;

a first metal oxide layer provided between the first conductive layer and the second conductive layer, the first metal oxide layer including a first metal element; and a second metal oxide layer provided between the first metal oxide layer and the second conductive layer, the second metal oxide layer including a second metal element different from the first metal element, wherein the second metal oxide layer includes a halogen element.

Clause 4. The memory device according to clause 3, wherein the first metal oxide layer includes at least one element selected from the group consisting of nitrogen (N), phosphorus (P), and arsenic (As).

Clause 5. A memory device comprising:

a first conductive layer;

a second conductive layer;

a first metal oxide layer provided between the first conductive layer and the second conductive layer, the first metal oxide layer including a first metal element; and a second metal oxide layer provided between the first metal oxide layer and the second conductive layer, the second metal oxide layer including a second metal element different from the first metal element, wherein the first metal oxide layer includes at least one element selected from the group consisting of nitrogen (N), phosphorus (P), and arsenic (As).

Clause 6. A memory device comprising:

a first conductive layer;

a second conductive layer;

a first metal oxide layer provided between the first conductive layer and the second conductive layer, the first metal oxide layer including a first metal element; and a second metal oxide layer provided between the first metal oxide layer and the second conductive layer, the second metal oxide layer including a second metal element different from the first metal element, wherein the second metal oxide layer includes at least one element selected from the group consisting of nitrogen (N), phosphorus (P), and arsenic (As).

Clause 7. The memory device according to claim 5, wherein the first metal element is at least one metal element selected from the group consisting of aluminum (Al), gallium (Ga), zirconium (Zr), and hafnium (Hf), and the second metal element is at least one metal element selected from the group consisting of zinc (Zn), titanium (Ti), tin (Sn), vanadium (V), niobium (Nb), tantalum (Ta), and tungsten (W).

Clause 8. A memory device comprising:

a first conductive layer;

a second conductive layer;

a first metal oxide layer provided between the first conductive layer and the second conductive layer, the first metal oxide layer including at least one first metal element selected from the group consisting of aluminum (Al), gallium (Ga), zirconium (Zr), and hafnium (Hf);

a second metal oxide layer provided between the first metal oxide layer and the second conductive layer, the second metal oxide layer including at least one second metal element selected from the group consisting of zinc (Zn), titanium (Ti), tin (Sn), vanadium (V), niobium (Nb), tantalum (Ta), and tungsten (W); and an amorphous silicon layer provided between the first conductive layer and the first metal oxide layer, wherein the first metal oxide layer includes a third metal element, and the third metal element has a lower valence than a metal element having the highest atomic percent in the first metal oxide layer among the at least one first metal element.

What is claimed is:

1. A memory device comprising:
    a first conductive layer;
    a second conductive layer;
    a first metal oxide layer provided between the first conductive layer and the second conductive layer, the first metal oxide layer including at least one first metal element selected from the group consisting of aluminum (Al), gallium (Ga), zirconium (Zr), and hafnium (Hf); and
    a second metal oxide layer provided between the first metal oxide layer and the second conductive layer, the second metal oxide layer including at least one second metal element selected from the group consisting of zinc (Zn), titanium (Ti), tin (Sn), vanadium (V), niobium (Nb), tantalum (Ta), and tungsten (W),
    wherein the second metal oxide layer includes a third metal element, and the third metal element has a lower valence than a metal element having the highest atomic percent in the second metal oxide layer among the at least one second metal element.

2. The memory device according to claim 1, wherein the atomic percent of the third metal element in the second metal oxide layer is lower than the atomic percent of the metal element having the highest atomic percent in the second metal oxide layer among the at least one second metal element.

3. The memory device according to claim 1, wherein the first metal oxide layer includes a fourth metal element, and the fourth metal element has a higher valence than a metal element having the highest atomic percent in the first metal oxide layer among the at least one first metal element.

4. The memory device according to claim 1, wherein the first metal oxide layer includes a halogen element.

5. The memory device according to claim 1, wherein the second metal oxide layer includes at least one element selected from the group consisting of nitrogen (N), phosphorus (P), and arsenic (As).

6. The memory device according to claim 3, wherein the fourth metal element is at least one metal element selected from the group consisting of aluminum (Al), gallium (Ga), zirconium (Zr), hafnium (Hf), zinc (Zn), titanium (Ti), tin (Sn), vanadium (V), niobium (Nb), tantalum (Ta), and tungsten (W).

* * * * *